US012563909B2

(12) United States Patent
Chen et al.

(10) Patent No.: US 12,563,909 B2
(45) Date of Patent: Feb. 24, 2026

(54) DESCENDING ETCHING RESISTANCE IN ADVANCED SUBSTRATE PATTERNING

(71) Applicant: Applied Materials, Inc., Santa Clara, CA (US)

(72) Inventors: Chung-Chia Chen, San Jose, CA (US); Ji Young Choung, Hwaseong-si (KR); Dieter Haas, San Jose, CA (US); Yu-Hsin Lin, Zhubei (TW); Jungmin Lee, Santa Clara, CA (US); Wen-Hao Wu, San Jose, CA (US); Si Kyoung Kim, Gwangju-si (KR)

(73) Assignee: Applied Materials, Inc., Santa Clara, CA (US)

( * ) Notice: Subject to any disclaimer, the term of this patent is extended or adjusted under 35 U.S.C. 154(b) by 493 days.

(21) Appl. No.: 18/139,243

(22) Filed: Apr. 25, 2023

(65) Prior Publication Data

US 2023/0263012 A1 Aug. 17, 2023

Related U.S. Application Data

(63) Continuation-in-part of application No. 17/881,358, filed on Aug. 4, 2022, now Pat. No. 11,665,931.

(Continued)

(51) Int. Cl.
H10K 59/122 (2023.01)
H10K 59/173 (2023.01)
H10K 59/80 (2023.01)

(52) U.S. Cl.
CPC ......... H10K 59/122 (2023.02); H10K 59/173 (2023.02); H10K 59/873 (2023.02)

(58) Field of Classification Search
CPC ... H10K 59/122; H10K 59/173; H10K 59/873
See application file for complete search history.

(56) References Cited

U.S. PATENT DOCUMENTS 11,610,954 B1 * 3/2023 Lin .................... H10K 59/122
2023/0263012 A1 8/2023 Chen et al.
(Continued)

FOREIGN PATENT DOCUMENTS

CN 115884633 A 3/2023
KR 20170012707 A 2/2017
(Continued)

OTHER PUBLICATIONS

International Search Report and Written Opinion dated Aug. 27, 2024 for Application No. PCT/US2024/025796.

*Primary Examiner* — Shaun M Campbell
(74) *Attorney, Agent, or Firm* — Patterson + Sheridan, LLP

(57) ABSTRACT

Sub-pixel circuits and methods of forming sub-pixel circuits that may be utilized in a display such as an organic light-emitting diode (OLED) display. In one example, a device includes a substrate, pixel-defining layer (PDL) structures disposed over the substrate and defining sub-pixels of the device, and a plurality of overhang structures. The first sub-pixel includes a first anode, OLED material, a first cathode, and a first encapsulation layer having a gap defined by a first portion of the first encapsulation layer disposed over the first cathode, a second portion of the first encapsulation layer disposed over a sidewall of the body structure, and a third portion of the first encapsulation layer under an underside surface of the top extension of the top structure, the first portion of the first encapsulation layer contacting the third portion of the first encapsulation layer.

23 Claims, 15 Drawing Sheets

Related U.S. Application Data

(60) Provisional application No. 63/229,266, filed on Aug. 4, 2021.

(56) References Cited

U.S. PATENT DOCUMENTS

| | | | |
|---|---|---|---|
| 2024/0130168 A1* | 4/2024 | Kang | H10K 59/00 |
| 2024/0237493 A1 | 7/2024 | Chang et al. | |
| 2024/0298475 A1* | 9/2024 | Jiang | H10K 59/122 |

FOREIGN PATENT DOCUMENTS

| | | |
|---|---|---|
| KR | 102090555 B1 | 3/2020 |
| KR | 20200042996 A | 4/2020 |

* cited by examiner

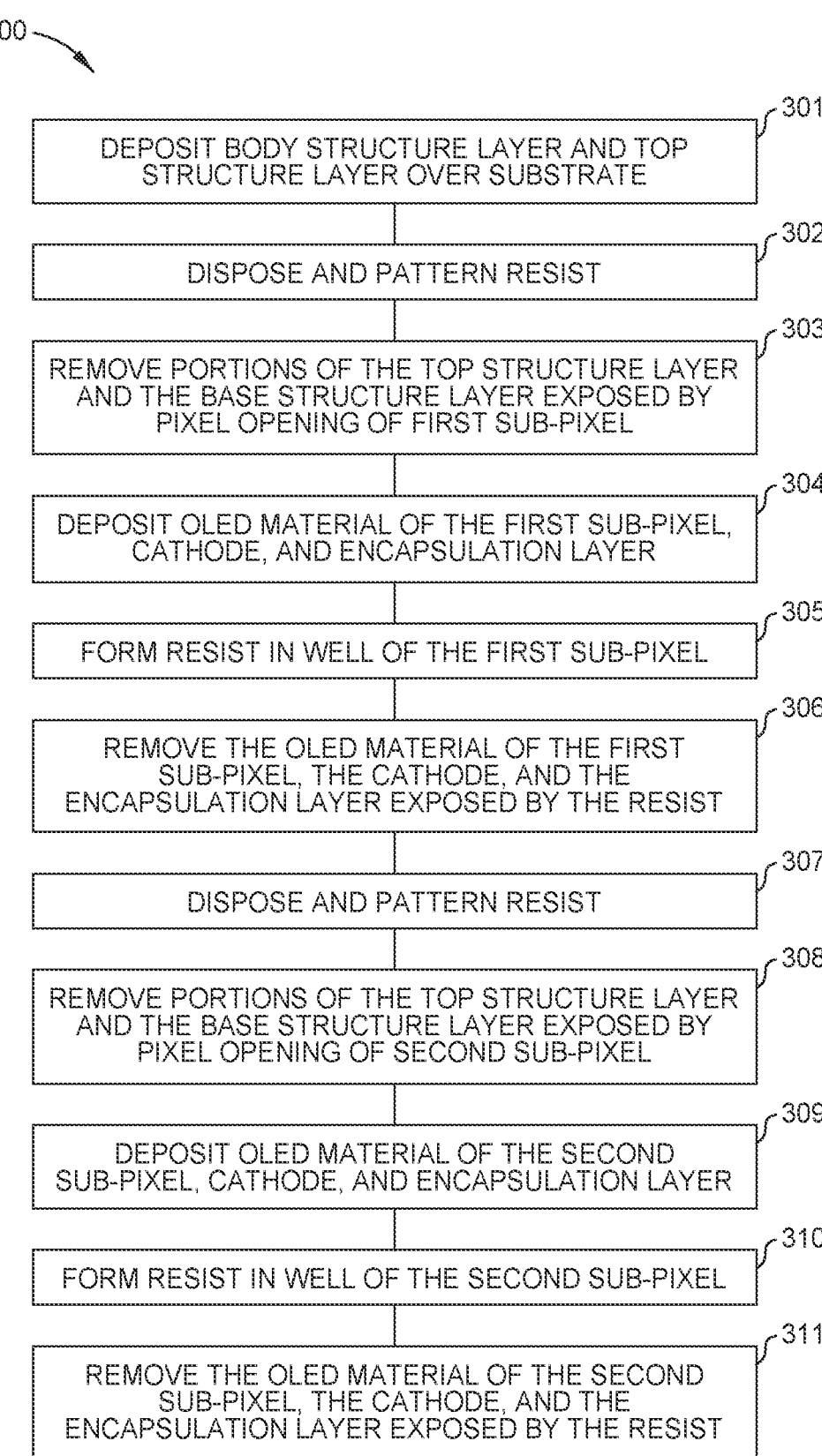

300

301
DEPOSIT BODY STRUCTURE LAYER AND TOP STRUCTURE LAYER OVER SUBSTRATE

302
DISPOSE AND PATTERN RESIST

303
REMOVE PORTIONS OF THE TOP STRUCTURE LAYER AND THE BASE STRUCTURE LAYER EXPOSED BY PIXEL OPENING OF FIRST SUB-PIXEL

304
DEPOSIT OLED MATERIAL OF THE FIRST SUB-PIXEL, CATHODE, AND ENCAPSULATION LAYER

305
FORM RESIST IN WELL OF THE FIRST SUB-PIXEL

306
REMOVE THE OLED MATERIAL OF THE FIRST SUB-PIXEL, THE CATHODE, AND THE ENCAPSULATION LAYER EXPOSED BY THE RESIST

307
DISPOSE AND PATTERN RESIST

308
REMOVE PORTIONS OF THE TOP STRUCTURE LAYER AND THE BASE STRUCTURE LAYER EXPOSED BY PIXEL OPENING OF SECOND SUB-PIXEL

309
DEPOSIT OLED MATERIAL OF THE SECOND SUB-PIXEL, CATHODE, AND ENCAPSULATION LAYER

310
FORM RESIST IN WELL OF THE SECOND SUB-PIXEL

311
REMOVE THE OLED MATERIAL OF THE SECOND SUB-PIXEL, THE CATHODE, AND THE ENCAPSULATION LAYER EXPOSED BY THE RESIST

FIG. 3

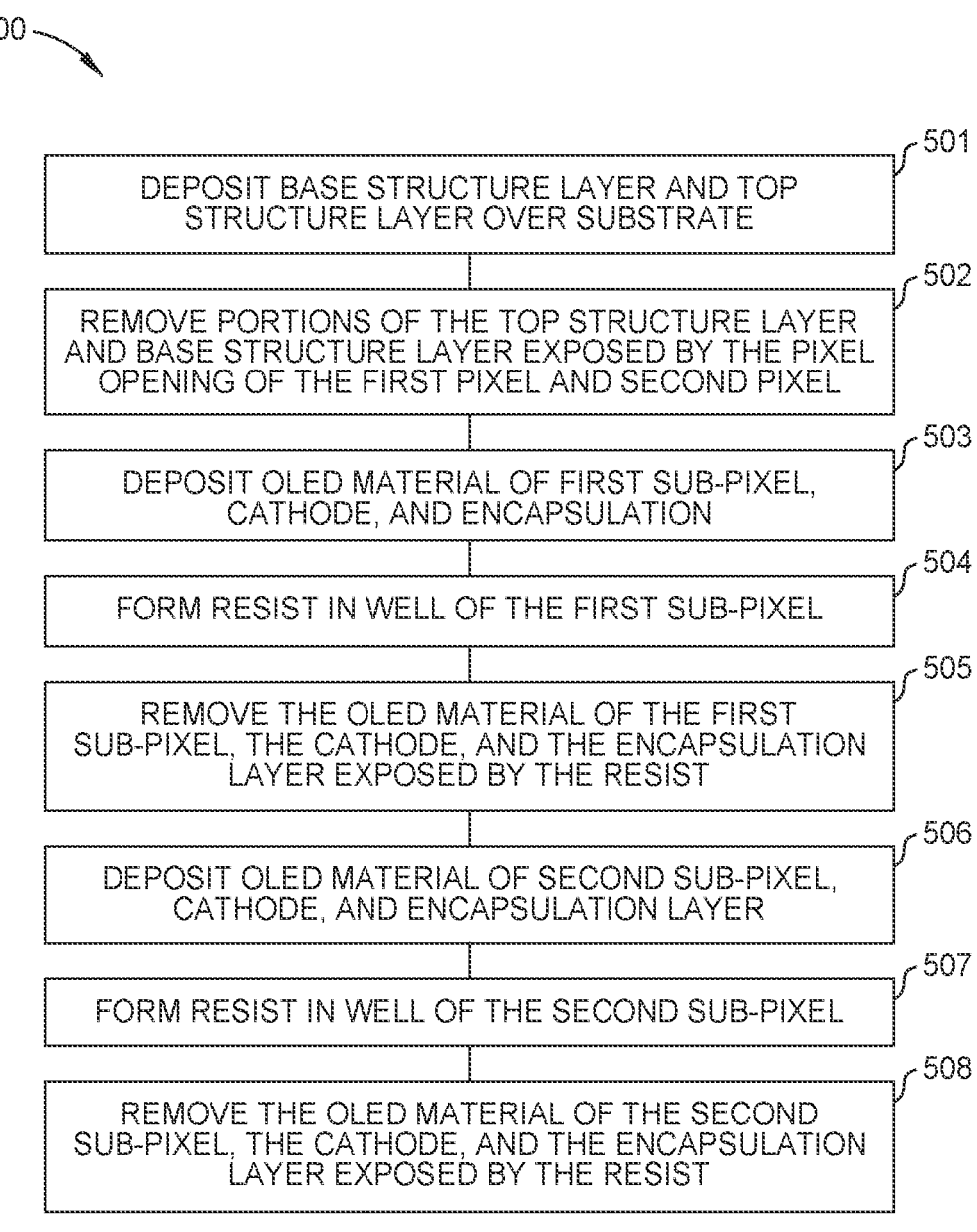

500

501
DEPOSIT BASE STRUCTURE LAYER AND TOP STRUCTURE LAYER OVER SUBSTRATE

502
REMOVE PORTIONS OF THE TOP STRUCTURE LAYER AND BASE STRUCTURE LAYER EXPOSED BY THE PIXEL OPENING OF THE FIRST PIXEL AND SECOND PIXEL

503
DEPOSIT OLED MATERIAL OF FIRST SUB-PIXEL, CATHODE, AND ENCAPSULATION

504
FORM RESIST IN WELL OF THE FIRST SUB-PIXEL

505
REMOVE THE OLED MATERIAL OF THE FIRST SUB-PIXEL, THE CATHODE, AND THE ENCAPSULATION LAYER EXPOSED BY THE RESIST

506
DEPOSIT OLED MATERIAL OF SECOND SUB-PIXEL, CATHODE, AND ENCAPSULATION LAYER

507
FORM RESIST IN WELL OF THE SECOND SUB-PIXEL

508
REMOVE THE OLED MATERIAL OF THE SECOND SUB-PIXEL, THE CATHODE, AND THE ENCAPSULATION LAYER EXPOSED BY THE RESIST

FIG. 5

DESCENDING ETCHING RESISTANCE IN ADVANCED SUBSTRATE PATTERNING

CROSS-REFERENCE TO RELATED APPLICATIONS

This application is a continuation-in-part of U.S. patent application Ser. No. 17/881,358, filed Aug. 4, 2022, which claims priority to U.S. Provisional Patent Application Ser. No. 63/229,266, filed on Aug. 4, 2021, which are herein incorporated by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photolithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits that may be utilized in a display such as an organic OLED display.

SUMMARY

[In one embodiment, a device is provided. The device includes a substrate, pixel-defining layer (PDL) structures disposed over the substrate and defining sub-pixels of the device, and a plurality of overhang structures. Each overhang structure is defined by a top extension of a top structure extending laterally past a body structure, each body structure is disposed over an upper surface of each PDL structure, adjacent overhang structures of the plurality overhang structures define a plurality of sub-pixels including a first sub-pixel. The first sub-pixel includes a first anode, a first organic light-emitting diode (OLED) material disposed over the first anode and under the adjacent overhang structures, a first cathode disposed over the first OLED material and under the adjacent overhang structures, and a first encapsulation layer having a gap defined by a first portion of the first encapsulation layer disposed over the first cathode, a second portion of the first encapsulation layer disposed over a sidewall of the body structure, and a third portion of the first encapsulation layer under an underside surface of the top extension of the top structure, the first portion of the first encapsulation layer contacting the third portion of the first encapsulation layer.

In another embodiment, a device is provided. The device includes a substrate, pixel-defining layer (PDL) structures disposed over the substrate and defining sub-pixels of the device, and a plurality of overhang structures. Each overhang structure is defined by a top extension of a top structure extending laterally past a body structure to form an overhang, each body structure is disposed over an upper surface of each PDL structure, adjacent overhang structures of the plurality overhang structures define a plurality of sub-pixels including a first sub-pixel and a second sub-pixel. the first sub-pixel includes a first anode, a first organic light-emitting diode (OLED) material disposed over the first anode and under the adjacent overhang structures, a first cathode disposed over the first OLED material and under the adjacent overhang structures, and a first encapsulation layer having a gap defined by a first portion of the first encapsulation layer disposed over the first cathode, a second portion of the first encapsulation layer disposed over a sidewall of the body structure, and a third portion of the first encapsulation layer under an underside surface of the top extension of the top structure, the first portion of the first encapsulation layer contacting the third portion of the first encapsulation layer. The second sub-pixel includes a second anode, a second organic light-emitting diode (OLED) material disposed over the second anode and under the adjacent overhang structures, a second cathode disposed over the second OLED material and under the adjacent overhang structures, and a second encapsulation layer having the gap defined by the first portion of the second encapsulation layer disposed over the second cathode, the second portion of the second encapsulation layer disposed over the sidewall of the body structure, and the third portion of the second encapsulation layer under the underside surface of the top extension of the top structure, the first portion of the second encapsulation layer contacting the third portion of the second encapsulation layer.

In another embodiment, a device is provided. The device includes a substrate, pixel-defining layer (PDL) structures disposed over the substrate and defining sub-pixels of the device, and a plurality of overhang structures. Each overhang structure is defined by a top extension of a top structure extending laterally past a body structure, each body structure is disposed over an upper surface of each PDL structure, adjacent overhang structures of the plurality overhang structures define a plurality of sub-pixels including a first sub-pixel. The first sub-pixel includes a first anode, a first organic light-emitting diode (OLED) material disposed over and in contact with the first anode and under the adjacent overhang structures, a first cathode disposed over the first OLED material and under the adjacent overhang structures, and a first encapsulation layer having a gap defined by a first portion of the first encapsulation layer contacting the first cathode, a second portion of the first encapsulation layer contacting a sidewall of the body structure, and a third portion of the first encapsulation layer contacting an underside surface of the top extension of the top structure, the first portion of the first encapsulation layer contacting the third portion of the first encapsulation layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3 is a flow a flow diagram of an on-demand method for forming a sub-pixel circuit according to embodiments.

FIG. 5 is a flow a flow diagram of a one-step method for forming a sub-pixel circuit according to embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to a display. More specifically, embodiments described herein relate to sub-pixel circuits and methods of forming sub-pixel circuits that may be utilized in a display such as an organic light-emitting diode (OLED) display.

Each of the embodiments described herein of the sub-pixel circuit include a plurality of sub-pixels with each of the sub-pixels defined by adjacent overhang structures that are permanent to the sub-pixel circuit. While the Figures depict three sub-pixels with each sub-pixel defined by adjacent overhang structures, the sub-pixel circuit of the embodiments described herein include a plurality of sub-pixels, such as three or more sub-pixels. Each sub-pixel has the OLED material configured to emit a white, red, green, blue or other color light when energized. E.g., the OLED material of a first sub-pixel emits a red light when energized, the OLED material of a second sub-pixel emits a green light when energized, and the OLED material of a third sub-pixel emits a blue light when energized.

The overhang structures are permanent to the sub-pixel circuit and include at least a top structure disposed over a body structure. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition is utilized for deposition of OLED materials (including a hole injection layer (HIL), a hole transport layer (HTL), an emissive layer (EML), and an electron transport layer (ETL)) and cathode. In one embodiment, the HIL layer has a greater conductivity than the HTL layer. In another embodiment, the HIL layer has a greater energy level than the HTL layer. In some instances, an encapsulation layer may be disposed via evaporation deposition. In embodiments including one or more capping layers, the capping layers are disposed between the cathode and the encapsulation layer. The overhang structures and the evaporation angle set by the evaporation source define the deposition angles, i.e., the overhang structures provide for a shadowing effect during evaporation deposition with the evaporation angle set by the evaporation source. In order to deposit at a particular angle, the evaporation source is configured to emit the deposition material at a particular angle with regard to the overhang structure. The encapsulation layer of a respective sub-pixel is disposed over the cathode with the encapsulation layer extending under at least a portion of each of the adjacent overhang structures. The encapsulation layer of each sub-pixel contacts at least a portion of a sidewall of each of the adjacent overhang structures. The encapsulation layer can be varied by thickness, composition, and deposition method depending on the OLED materials deposited on the sub-pixels.

Figures 1A, 1B:
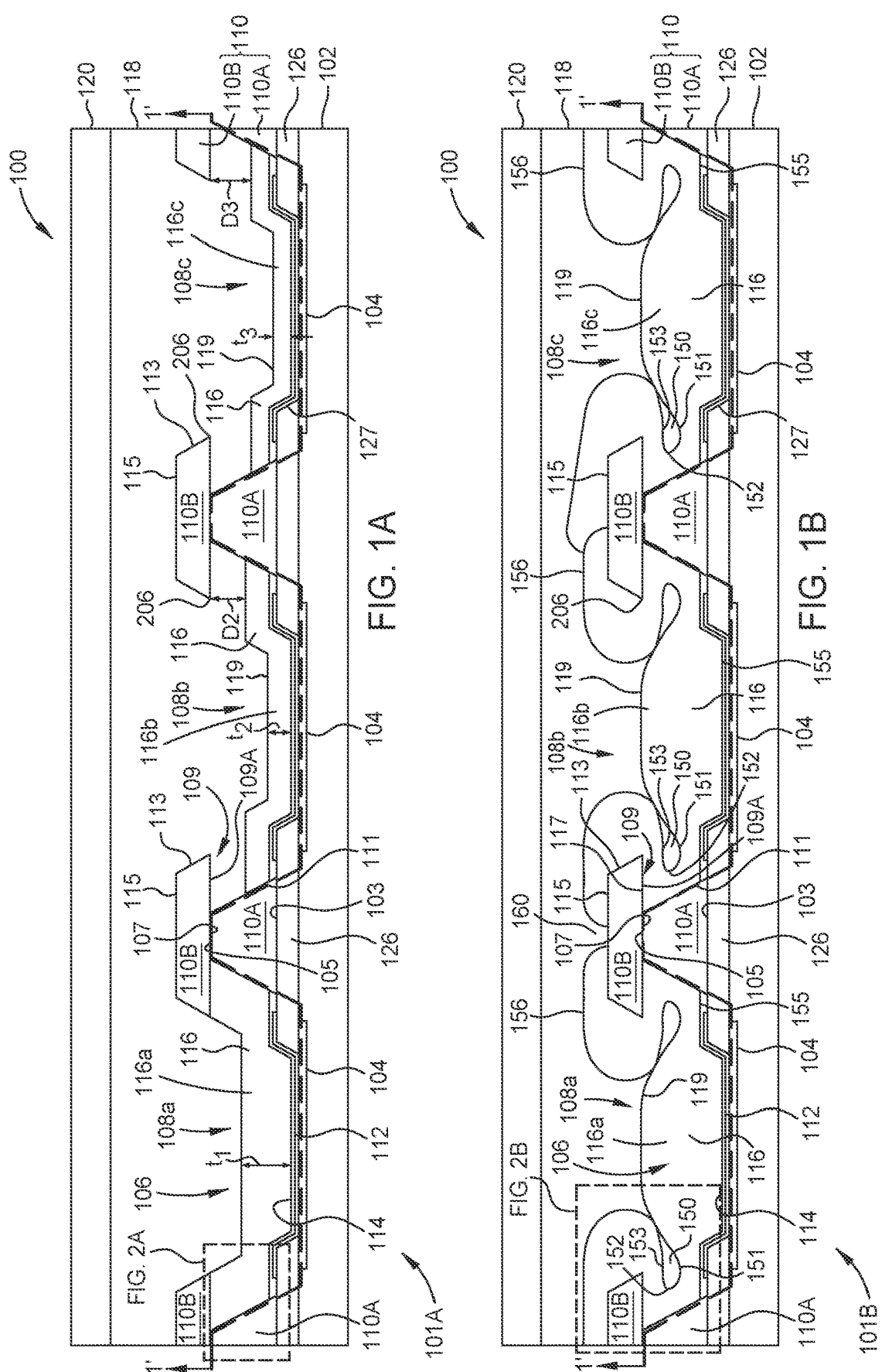
FIG. 1A is a schematic, cross-sectional view of a sub-pixel circuit, according to embodiments.
FIG. 1B is a schematic, cross-sectional view of a sub-pixel circuit, according to embodiments.

FIG. 1A is a schematic, cross-sectional view of a sub-pixel circuit 100 having an arrangement 101A. The cross-sectional view of FIG. 1A is taken along section line 1'-1' of FIGS. 1C and 1D. FIG. 1B is a schematic, cross-sectional view of a sub-pixel circuit 100 having arrangement 101B. The cross-sectional view of FIG. 1B is taken along section line 1'-1' of FIGS. 1C and 1D.

The sub-pixel circuit 100 includes a substrate 102. Metal-containing layers 104 may be patterned on the substrate 102 and are defined by adjacent pixel-defining layer (PDL) structures 126 disposed on the substrate 102. In one embodiment, the metal-containing layers 104 are pre-patterned on the substrate 102. E.g., the substrate 102 is a pre-patterned indium tin oxide (ITO) glass substrate. The metal-containing layers 104 are configured to operate anodes of respective sub-pixels. The metal-containing layers 104 include, but are not limited to, chromium, titanium, gold, silver, copper, aluminum, ITO, a combination thereof, or other suitably conductive materials.

The PDL structures 126 are disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide (SiO$_2$), silicon nitride (Si$_3$N$_4$), silicon oxynitride (Si$_2$N$_2$O), magnesium fluoride (MgF$_2$), or combinations thereof. Adjacent PDL structures 126 define a respective sub-pixel and expose the anode (i.e., metal-containing layer 104) of the respective sub-pixel of the sub-pixel circuit 100.

The sub-pixel circuit 100 has a plurality of sub-pixels 106 including at least a first sub-pixel 108a, a second sub-pixel 108b, and a third sub-pixel 108c. While the Figures depict the first sub-pixel 108a, the second sub-pixel 108b, and the third sub-pixel 108c, the sub-pixel circuit 100 of the embodiments described herein may include three or more sub-pixels 106, such as a fourth and a fifth sub-pixel. Each sub-pixel 106 has an organic light-emitting diode (OLED) material 112 configured to emit a white, red, green, blue or other color light when energized. E.g., the OLED material 112 of the first sub-pixel 108a emits a red light when energized, the OLED material of the second sub-pixel 108b emits a green light when energized, the OLED material of a third sub-pixel 108c emits a blue light when energized, and the OLED material of a fourth sub-pixel and a fifth sub-pixel emits another color light when energized.

Overhang structures 110 are disposed on an upper surface 103 of each of the PDL structures 126. The overhang structures 110 are permanent to the sub-pixel circuit. The overhang structures 110 further define each sub-pixel 106 of the sub-pixel circuit 100. The overhang structures 110 include at least a top structure 110B disposed over a body structure 110A. In one embodiment, the top structure 110B is disposed on the body structure 110A. The body structure 110A is disposed over the upper surface 103 of the PDL structure 126. In one embodiment, the body structure 110A is disposed on the upper surface 103 of the PDL structure 126. Each overhang structure 110 includes adjacent overhangs 109. The adjacent overhangs 109 are defined by a top extension 109A of the top structure 110B extending laterally past a sidewall 111 of the body structure 110A.

The top structure 110B includes one of a non-conductive material, inorganic material, or metal-containing material. The body structure 110A includes an non-conductive material, inorganic material, or metal-containing material. The non-conductive material includes, but it not limited to, an inorganic silicon-containing material. E.g., the silicon-containing material includes oxides or nitrides of silicon, or combinations thereof. The metal-containing materials include at least one of a metal or metal alloy such as titanium (Ti), aluminum (Al), aluminum neodymium (AlNd), molybdenum (Mo), molybdenum tungsten (MoW), copper (Cu), or combinations thereof. The inorganic materials of the body structure 110A and the top structure 110B include silicon nitride ($Si_3N_4$), silicon oxide ($SiO_2$), silicon oxynitride ($Si_2N_2O$), or combinations thereof. The overhang structures 110 are able to remain in place, i.e., are permanent. Thus, organic material from lifted off overhang structures that disrupt OLED performance would not be left behind. Eliminating the need for a lift-off procedure also increases throughput.

In one example, the top structure 110B includes a non-conductive inorganic material and the body structure 110A includes a conductive inorganic material or a metal-containing material. In another example, the top structure 110B includes a conductive inorganic material or metal-containing material and the body structure 110A includes a conductive inorganic material or metal-containing material.

Figure 2A:
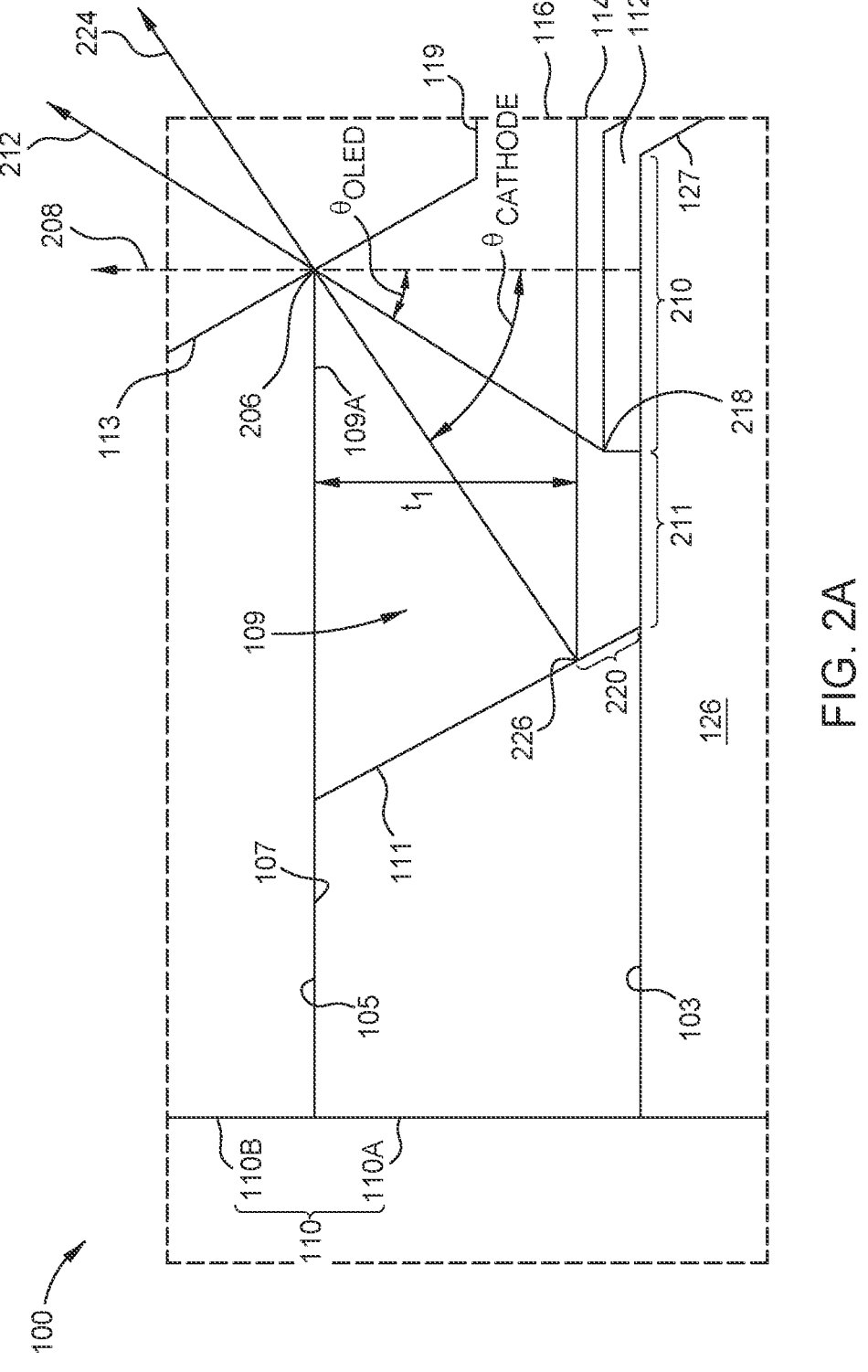
FIG. 2A is a schematic, cross-sectional view of an overhang structure of a sub-pixel circuit, according to embodiments.
Figure 2B:
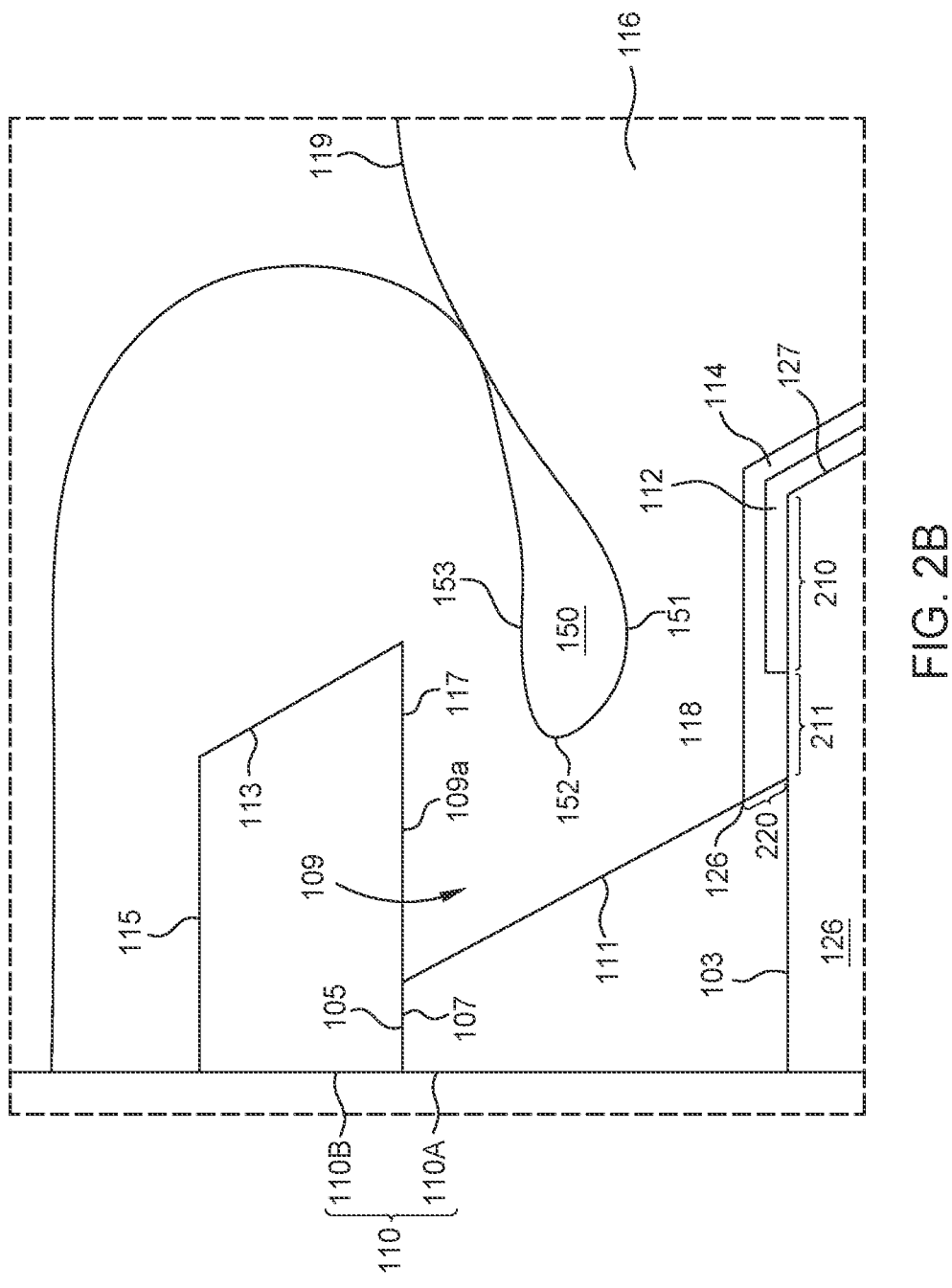
FIG. 2B is a schematic, cross-sectional view of an overhang structure of a sub-pixel circuit, according to embodiments.

Adjacent overhangs 109 are defined by the top extension 109A of the top structure 110B. At least a bottom surface 107 of the top structure 110B is wider than a top surface 105 of the body structure 110A to form the top extension 109A (as shown in FIGS. 1A and 1B) of the overhang 109. The top structure 110B is disposed over a top surface 105 of the body structure 110A. The top extension 109A of the top structure 110B forms the overhang 109 and allows for the top structure 110B to shadow the body structure 110A. The shadowing of the overhang 109 provides for evaporation deposition of each of the OLED material 112 and a cathode 114. The OLED material 112 is disposed under the overhang 109. The cathode 114 is disposed over the OLED material 112 and extends under the overhang 109. In one embodiment, as shown in FIGS. 2A and 2B, the cathode 114 contacts a first portion 220 of the sidewall 111 of the body structure 110A.

The overhang structures 110 and an evaporation angle set by an evaporation source define deposition angles, i.e., the overhang structures 110 provide for a shadowing effect during evaporation deposition with the evaporation angle set by the evaporation source. The overhang 109 and the evaporation source define an OLED angle $\theta_{OLED}$ of the OLED material 112 and a cathode angle $\theta_{cathode}$ of the cathode 114 (shown in FIG. 2A). The OLED angle $\theta_{OLED}$ of the OLED material 112 and the cathode angle $\theta_{cathode}$ of the cathode 114 result from the overhang structures 110 and the evaporation angle set by the evaporation source, i.e., the overhang structures 110 provide for a shadowing effect during evaporation deposition of the OLED material 112 and the cathode 114 with the evaporation angle set by the evaporation source. In one embodiment, the OLED material 112 and the cathode 114 contact the sidewall 111 of the body structure 110A of the overhang structures 110. In another embodiment, as shown in FIG. 1A, the cathode 114 contacts the sidewall 111 of the body structure 110A of the overhang structures 110. In one embodiment, as shown in FIG. 1A, the encapsulation layer 116 is disposed over the sidewall 111 of the body structure 110A and a bottom surface 107 of the top structure 110B. In another embodiment, the cathode 114 contacts busbars (not shown) outside of an active area of the sub-pixel circuit 100. The cathode 114 includes a conductive material, such as a metal or metal alloy. E.g., the cathode 114 includes, but are not limited to, chromium, titanium, aluminum, ITO, or a combination thereof. In some embodiments, the material of the cathode 114 is different from the material of the body structure 110A and the top structure 110B.

Each sub-pixel 106 includes an encapsulation layer 116, e.g., the first sub-pixel 108a has a first encapsulation layer 116A, the second sub-pixel 108b has a second encapsulation layer 116B, and the third sub-pixel 108c has a third encapsulation layer 116C. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of the overhang structures 110 and over at least a portion of a sidewall of each of the adjacent overhang structures 110. In one embodiment, as shown in sub-pixels 108b and 108c of FIG. 1A, the second encapsulation layer 116B and third encapsulation layer 116C are disposed over the cathode 114 and extends under the adjacent overhangs 109 to contact a second portion (not shown) the sidewall 111 of the body structure 110A. In another embodiment, as shown in sub-pixel 108a of FIG. 1A, the first encapsulation layer 116A is disposed over the sidewall 111 of the body structure 110A and a bottom surface 107 of the top structure 110B.

In another embodiment, as shown in sub-pixel 108a of FIG. 1B, the first encapsulation layer 116A is disposed over the sidewall 111 of the body structure 110A, the bottom surface 107 of the top structure 110B, a sidewall 113 of the top structure 110B, and a portion of a top surface 115 of the top structure 110B of the overhang structures 110. The first encapsulation layer 116A has gaps 150. Each of the gaps 150 is defined by a first portion 151, a second portion 152, a third portion 153, and the first portion 151 contacting the third portion 153 of the first encapsulation layer 116A. The first portion 151 of the first encapsulation layer 116A is disposed over the cathode 114. In some embodiments, the first portion 151 contacts the cathode 114. The second portion 152 of the first encapsulation layer 116A is disposed over the sidewall 111 of the body structure 110A. In some embodiments, the second portion 152 contacts the sidewall 111 of the body structure 110A. The third portion 153 of the first encapsulation layer 116A is disposed under an underside surface 117 of the top extension 109A of the top structure 110B. In some embodiments, the third portion 153 contacts the underside surface 117 of the top extension 109A of the top structure 110B. The first portion 151 of the first encapsulation layer 116A contacts the third portion 153 of the first encapsulation layer 116A. The gaps 150 are sealed by the contact of the first portion 151 and the third portion 153. The first encapsulation layer 116A has an inner surface 155 and an outer surface 156. The inner surface 155 contacts the cathode 114, the sidewall 111 of the body structure 110A, and the underside surface 117 of the top extension 109A of the top surface 110B. The outer surface 156 encloses void spaces outside the first encapsulation layer 116A. The void spaces correspond to the gaps 150. In one or more embodiments, the gaps 150 and the voids have a size less than the height of the overhang 109. In one or more embodiments, the gaps 150 and the voids have a size less than 1.5 μm, such as less than 0.5 μm.

In some embodiments, as shown in second sub-pixel 108b of FIG. 1B, the second encapsulation layer 116B is disposed over the sidewall 111 of the body structure 110A, the bottom surface 107 of the top structure 110B, the sidewall 113 of the top structure 110B, and the portion of the top surface 115 of the top structure 110B of the overhang structures 110. The second encapsulation layer 116B has the gaps 150. Each of the gaps 150 is defined by the first portion 151, the second portion 152, the third portion 153, and the first portion 151 contacting the third portion 153 of the second encapsulation layer 116B. The first portion 151 of the second encapsulation layer 116B is disposed over the cathode 114. In some embodiments, the first portion 151 contacts the cathode 114. The second portion 152 of the second encapsulation layer 116B is disposed over the sidewall 111 of the body structure 110A. In some embodiments, the second portion 152 contacts the sidewall 111 of the body structure 110A. The third portion 153 of the second encapsulation layer 116B is disposed under the underside surface 117 of the top extension 109A of the top structure 110B. In some embodiments, the third portion 153 contacts the underside surface 117 of the top extension 109A of the top structure 110B. The first portion 151 of the second encapsulation layer 116B contacts the third portion 153 of the second encapsulation layer 116B. The gaps 150 are sealed by the contact of the first portion 151 and the third portion 153. The second encapsulation layer 116B has the inner surface 155 and the outer surface 156. The inner surface 155 contacts the cathode 114, the sidewall 111 of the body structure 110A, and the underside surface 117 of the top extension 109A of the top surface 110B. The outer surface 156 encloses the void spaces outside the second encapsulation layer 116B. The void spaces correspond to the gaps 150.

In some embodiments, the portion of the top surface 115 of the top structure 110B that the first encapsulation layer 116A is disposed over is separated from the portion of the top surface 115 of the top structure 110B that the second encapsulation layer 116B is disposed over. A space 160 therefore exists between the first encapsulation layer 116A and the second encapsulation layer 116B, as shown in FIG. 1B. In some embodiments, the first encapsulation layer 116A overlaps with the second encapsulation layer 116B.

In some embodiments, as shown in third sub-pixel 108c of FIG. 1B, the third encapsulation layer 116C is disposed over the sidewall 111 of the body structure 110A, the bottom surface 107 of the top structure 110B, the sidewall 113 of the top structure 110B, and the portion of the top surface 115 of the top structure 110B of the overhang structures 110. The third encapsulation layer 116C has the gaps 150. Each of the gaps 150 is defined by the first portion 151, the second portion 152, the third portion 153, and the first portion 151 contacting the third portion 153 of the third encapsulation layer 116C. The first portion 151 of the third encapsulation layer 116C is disposed over the cathode 114. In some embodiments, the first portion 151 contacts the cathode 114. The second portion 152 of the third encapsulation layer 116C is disposed over the sidewall 111 of the body structure 110A. In some embodiments, the second portion 152 contacts the sidewall 111 of the body structure 110A. The third portion 153 of the third encapsulation layer 116C is disposed under the underside surface 117 of the top extension 109A of the top structure 110B. In some embodiments, the third portion 153 contacts the underside surface 117 of the top extension 109A of the top structure 110B. The first portion 151 of the third encapsulation layer 116C contacts the third portion 153 of the third encapsulation layer 116C. The gaps 150 are sealed by the contact of the first portion 151 and the third portion 153. The third encapsulation layer 116C has the inner surface 155 and the outer surface 156. The inner surface 155 contacts the cathode 114, the sidewall 111 of the body structure 110A, and the underside surface 117 of the top extension 109A of the top surface 110B. The outer surface 156 encloses the void spaces outside the third encapsulation layer 116C. The void spaces correspond to the gaps 150.

In some embodiments, the portion of the top surface 115 of the top structure 110B that the second encapsulation layer 116B is disposed over is separated from the portion of the top surface 115 of the top structure 110B that the third encapsulation layer 116C is disposed over. The space 160 therefore exists between the second encapsulation layer 116B and the third encapsulation layer 116C. In some embodiments, the second encapsulation layer 116B overlaps with the third encapsulation layer 116C, as shown in FIG. 1B.

In embodiments including one or more capping layers, the capping layers are disposed between the cathode 114 and the encapsulation layer 116. E.g., a first capping layer and a second capping layer are disposed between the cathode 114 and the encapsulation layer 116. Each of the embodiments described herein may include one or more capping layers disposed between the cathode 114 and the encapsulation layer 116. The first capping layer may include an organic material. The second capping layer may include an inorganic material, such as lithium fluoride. The first capping layer and the second capping layer may be deposited by evaporation deposition. In another embodiment, the sub-pixel circuit 100 further includes at least a global passivation layer 120 disposed over the overhang structure 110 and the encapsulation layer 116. In yet another embodiment, the sub-pixel includes an intermediate passivation layer disposed over the overhang structures 110 of each of the sub-pixels 106, and disposed between the encapsulation layer 116 and the global passivation layer 120.

The arrangement 101A and the arrangement 101B of the sub-pixel circuit 100 further include at least a global passivation layer 120 disposed over the overhang structures 110 and the encapsulation layers 116. In one embodiment, an intermediate layer 118 may be disposed between the global passivation layer 120 and the overhang structures 110 and the encapsulation layers 116. The intermediate layer 118 may include an inkjet material, such as an acrylic material.

Figures 1C, 1D:
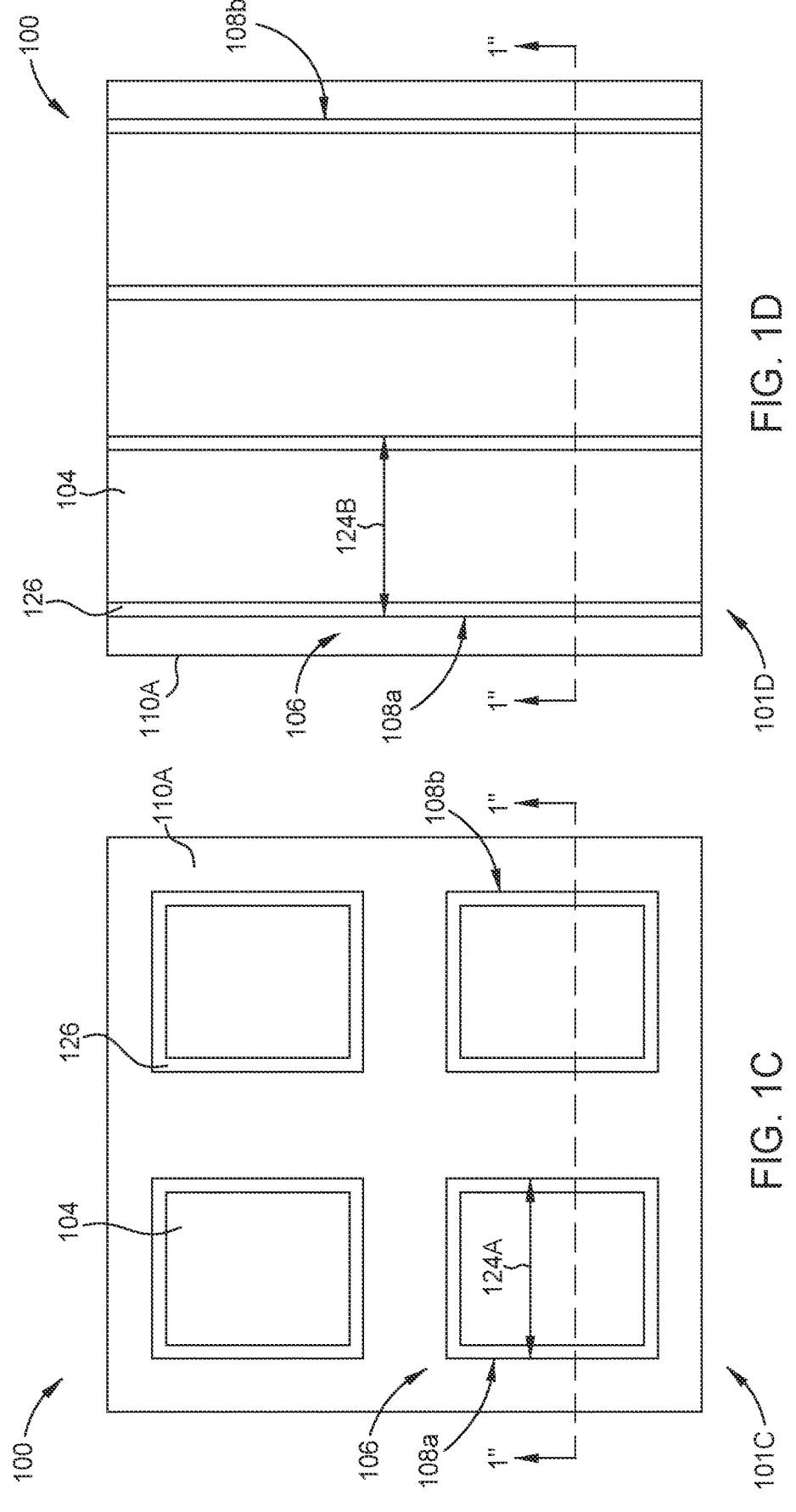
FIG. 1C is a schematic, top sectional view of a sub-pixel circuit having a dot-type architecture, according to embodiments.
FIG. 1D is a schematic, cross-sectional view of a sub-pixel circuit having a line-type architecture, according to embodiments.

FIG. 1C is a schematic, top sectional view of a sub-pixel circuit 100 having a dot-type architecture 101C. FIG. 1D is a schematic, cross-sectional view of a sub-pixel circuit 100 having a line-type architecture 101D. Each of the top sectional views of FIGS. 1C and 1D are taken along section line 1'-1' of FIGS. 1A and 1B. The dot-type architecture 101C includes a plurality of pixel openings 124A from adjacent PDL structures 126. Each of pixel opening 124A is surrounded by overhang structures 110, as shown in FIG. 1A, that defines each of the sub-pixels 106 of the dot-type architecture 101C. The line-type architecture 101D includes a plurality of pixel openings 124B from adjacent PDL structures 126. Each of pixel opening 124B is abutted by overhang structures 110, as shown in FIG. 1A, that define each of the sub-pixels 106 of the line-type architecture 101D.

FIG. 2A is a schematic, cross-sectional view of an overhang structure 110 of a sub-pixel circuit 100. FIG. 2B is a schematic, cross-sectional view of an overhang structure 110 of a sub-pixel circuit 100. In one embodiment, the overhang structures 110 include a top structure 110B of a non-conductive inorganic material and a body structure 110A of a conductive inorganic material. In another embodiment, the overhang structures 110 including the top structure 110B of a conductive inorganic material and the body structure 110A of a conductive inorganic material. In one embodiment, the cathode 114 contacts the body structure 110A of the overhang structures 110. In another embodiment, as shown in FIG. 2B, the encapsulation layer 116 has the gaps 150. Each of the gaps 150 is defined by the first portion 151, the second portion 152, the third portion 153, and the first portion 151 contacting the third portion 153 of the encapsulation layer 116. The first portion 151 of the encapsulation layer 116 is disposed over the cathode 114. In some embodiments, the first portion 151 contacts the cathode 114. The second portion 152 of the encapsulation layer 116 is disposed over the sidewall 111 of the body structure 110A. In some embodiments, the second portion 152 contacts the sidewall 111 of the body structure 110A. The third portion 153 of the encapsulation layer 116 disposed under the underside surface 117 of the top extension 109A of the top structure 110B. In some embodiments, the third portion 153 contacts the underside surface 117 of the top extension 109A of the top structure 110B. The first portion 151 of the encapsulation layer 116 contacts the third portion 153 of the encapsulation layer 116. The gaps 150 are sealed by the contact of the first portion 151 and the third portion 153.

The top structure 110B includes an underside edge 206 and an overhang vector 208. The underside edge 206 extends past the sidewall 111 of the body structure 110A. The overhang vector 208 is defined by the underside edge 206 and the PDL structure 126. The OLED material 112 is disposed over the metal-containing layer 104, over the sidewall 127 of the PDL structure 126, and over a first portion 210 of the upper surface 103 of the PDL structure 126, extending under the overhang 109 to an OLED endpoint 218. The OLED material 112 forms an OLED angle $\theta_{OLED}$ between an OLED vector 212 and the overhang vector 208. The OLED vector 212 is defined by an OLED endpoint 218 extending under the top structure 110B and the underside edge 206 of the top structure 110B. In one embodiment, the OLED material 112 may include one or more of a HIL, a HTL, an EML, and an ETL.

The cathode 114 is disposed over the OLED material 112, over the first portion 210 of the PDL structure 126, and over a second portion 211 of the upper surface 103 of the PDL structures 126 in each sub-pixel 106. In some embodiments, which can be combined with other embodiments described herein, the cathode 114 is disposed on a first portion 220 of the sidewall 111 of the body structure 110A. In other embodiments, as shown in FIG. 2A, the cathode 114 forms a cathode angle $\theta_{cathode}$ between a cathode vector 224 and the overhang vector 208. The cathode vector 224 is defined by a cathode endpoint 226 extending under the top structure 110B and the underside edge 206 of the top structure 110B.

The encapsulation layer 116 is disposed over the cathode 114 (and OLED material 112) with the encapsulation layer 116 extending at least under the top structure 110B of the overhang structure 110 and over at least a portion of a sidewall of the overhang structure 110. In one embodiment, as shown in sub-pixels 108a,108b, and 108c of FIG. 1A, the second encapsulation layer 116B and the third encapsulation layer 116C are disposed over the cathode 114 and extends under the adjacent overhangs 109 to contact a second portion (not shown) of the sidewall 111 of the body structure 110A. In another embodiment, as shown in FIG. 2A, the first encapsulation layer 116A is disposed over the sidewall 111 of the body structure 110A and a bottom surface 107 of the top structure 110B. In another embodiment, as shown in FIG. 2B, the first encapsulation layer 116A contacts the sidewall 111 of the body structure 110A, the bottom surface 107 of the top structure 110B, a sidewall 113 of the top structure 110B, and a portion of a top surface 115 of the top structure 110B of the overhang structures 110. The encapsulation layer 116 further includes a top surface 119 that defines the uppermost edge of the encapsulation layer 116 between the sidewalls 111 of the body structure 110A.

In one embodiment, as shown in FIG. 1A, the encapsulation layer 116 may be varied using deposition thicknesses. Each encapsulation layer 116 has a thickness. The thickness is the distance from the bottom surface of the encapsulation layer to the top surface of the encapsulation layer 116. The first encapsulation layer 116A has a first thickness $t_1$, the second encapsulation layer 116B has a second thickness $t_2$, and the third encapsulation layer 116C has a third thickness $t_3$. In another embodiment, the second thickness $t_2$ is different from the first thickness $t_1$, and the third thickness $t_3$ that is different from the first thickness $t_1$ and the second thickness $t_2$. In one embodiment, as shown in FIG. 1A, the thickness $t_1$ is greater than the thicknesses $t_2$ and $t_3$, and thickness $t_2$ is greater than thickness $t_3$.

In another embodiment, the thickness of the encapsulation layer 116 is increased as the wavelength of the light emitted increases, e.g., the first encapsulation layer 116A thickness $t_1$ is thickest at sub-pixel 108a having a red OLED material 112 (~580 nm), the second encapsulation layer 116B thickness $t_2$ is thinner at second sub-pixel 108b having a green OLED material 112 (~540 nm), and the third encapsulation layer 116C thickness $t_3$ is thinnest at sub-pixel 108c having a blue OLED material 112 (~440 nm). In another embodiment, the thickness of the encapsulation layer 116 is decreased as the wavelength of light emitted increases, e.g. the first encapsulation layer 116A thickness $t_1$ is thinnest at sub-pixel 108a having a red OLED material 112 (~580 nm), the second encapsulation layer 116B thickness $t_2$ is thicker at second sub-pixel 108b having a green OLED material 112 (~540 nm), and the third encapsulation layer 116C thickness $t_3$ is thickest at sub-pixel 108c having a blue OLED material 112 (~440 nm). In another embodiment, the thickness of the encapsulation layer 116 may vary independent from the type of OLED light used at the sub-pixels 108a, 108b, and 108c. The encapsulation layer in each sub-pixel are varied in thickness in order to protect deposited layers during etching of subsequent encapsulation layers.

The encapsulation layer 116 includes the non-conductive inorganic material, such as the silicon-containing material. The silicon-containing material may include silicon nitride (e.g., $Si_3N_4$) materials, silicon oxynitride materials (e.g., $Si_2N_2O$), silicon oxide materials (e.g., $SiO_2$), or a combination thereof. In one embodiment, the first encapsulation layer 116A includes silicon nitride materials, the second encapsulation layer 116B includes a silicon oxynitride material, and the third encapsulation layer 116C includes silicon oxide. The thicknesses of the encapsulation layer 116 may depend on the etch selectivity of the material of the encapsulation layer 116. The silicon-containing materials can further be varied to change the optical properties of the encapsulation layer 116. For example, the silicon-containing materials can be tuned to increase or decrease the refractive index. The difference in refractive index can also effect the etching rate of the encapsulation layer 116. This allows for additional etch selectivity control of the encapsulation layer 116. In one embodiment, the first encapsulation layer 116A has a first refractive index, the second encapsulation layer 1166 has a second refractive index, and the third encapsulation layer 116C has a third refractive index. In this embodiment, the first refractive index, the second refractive index, and the third refractive index are different from each other.

In one embodiment, at least one of the first encapsulation layer 116A, the second encapsulation layer 116B, and the third encapsulation layer 116C may include at least two layers of the silicon-containing material. At least one of the first encapsulation layer 116A, the second encapsulation layer 116B, and the third encapsulation layer 116C includes a composition for at least one of the layers of the silicon-containing material that is different from the compositions of the other encapsulation layers 116. In a first example, the first encapsulation layer 116A includes a silicon oxynitride material over a silicon nitride material. The second encapsulation layer 116B includes a silicon oxide layer over a silicon nitride layer. The third encapsulation layer 116C includes a silicon nitride layer over a silicon oxide layer. In a second example, the first encapsulation layer 116A includes a silicon oxide layer over a silicon oxynitride layer. The second encapsulation layer 116B includes a silicon nitride layer over a silicon oxynitride layer. The third encapsulation layer 116C has a silicon oxynitride layer over a silicon oxide layer.

The encapsulation layer 116 may further be varied using different modes of deposition, e.g., atomic layer deposition (ALD), chemical vapor deposition (CVD), and physical vapor deposition (PVD). In one example, the first sub-pixel 108a includes silicon nitride deposited using CVD and silicon oxide deposited using ALD. The second sub-pixel 108b includes silicon nitride deposited using CVD and silicon oxynitride deposited using CVD. The third sub-pixel 108c includes silicon nitride deposited using CVD. The encapsulation layer 116 may further be varied between using an inductively coupled plasma (IDP) or a conductively coupled plasma (CCP) for the deposition processes.

By varying the encapsulation layer 116 compositions, deposition methods, and thicknesses, the encapsulation layer in each sub-pixel protects deposited layers during later processing and improves process yield and efficiency. The variation in encapsulation layer 116 thicknesses further controls the distance between the underside edge 206 and the top surface of the encapsulation layer 116, as shown in sub-pixels 108b and 108c in FIG. 1A and FIG. 2A. The distances control the amount of etching and deposition that occurs under the overhang structures 110, leading to increased OLED material 112 protection during subsequent deposition and etching.

During evaporation deposition of the OLED material 112, the underside edge 206 of the top structure 110B defines the position of the OLED endpoint 218. E.g., the OLED material 112 is evaporated at an OLED maximum angle that corresponds to the OLED vector 212 and the underside edge 206 ensures that the OLED material 112 is not deposited past the OLED endpoint 218. During evaporation deposition of the cathode 114, the underside edge 206 of the top structure 110B defines the position of the cathode endpoint 226. E.g., the cathode 114 is evaporated at a cathode maximum angle that corresponds to the cathode vector 224 and the underside edge 206 ensures that the cathode 114 is not deposited past the cathode endpoint 226. The OLED angle $\theta_{OLED}$ is less than the cathode angle $\theta_{cathode}$.

FIG. 3 is a flow diagram of a method 300 for forming a sub-pixel circuit 100, according to embodiments. FIGS. 4A-4K are schematic, cross-sectional views of a substrate 102 during the method 300 for forming the sub-pixel circuit 100, according to embodiments described herein. The method 300 described herein provides for the ability to fabricate both the sub-pixel circuit 100 with the dot-type architecture 101C and the sub-pixel circuit 100 with the line-type architecture 101D.

Figures 4A, 4B, 4C:
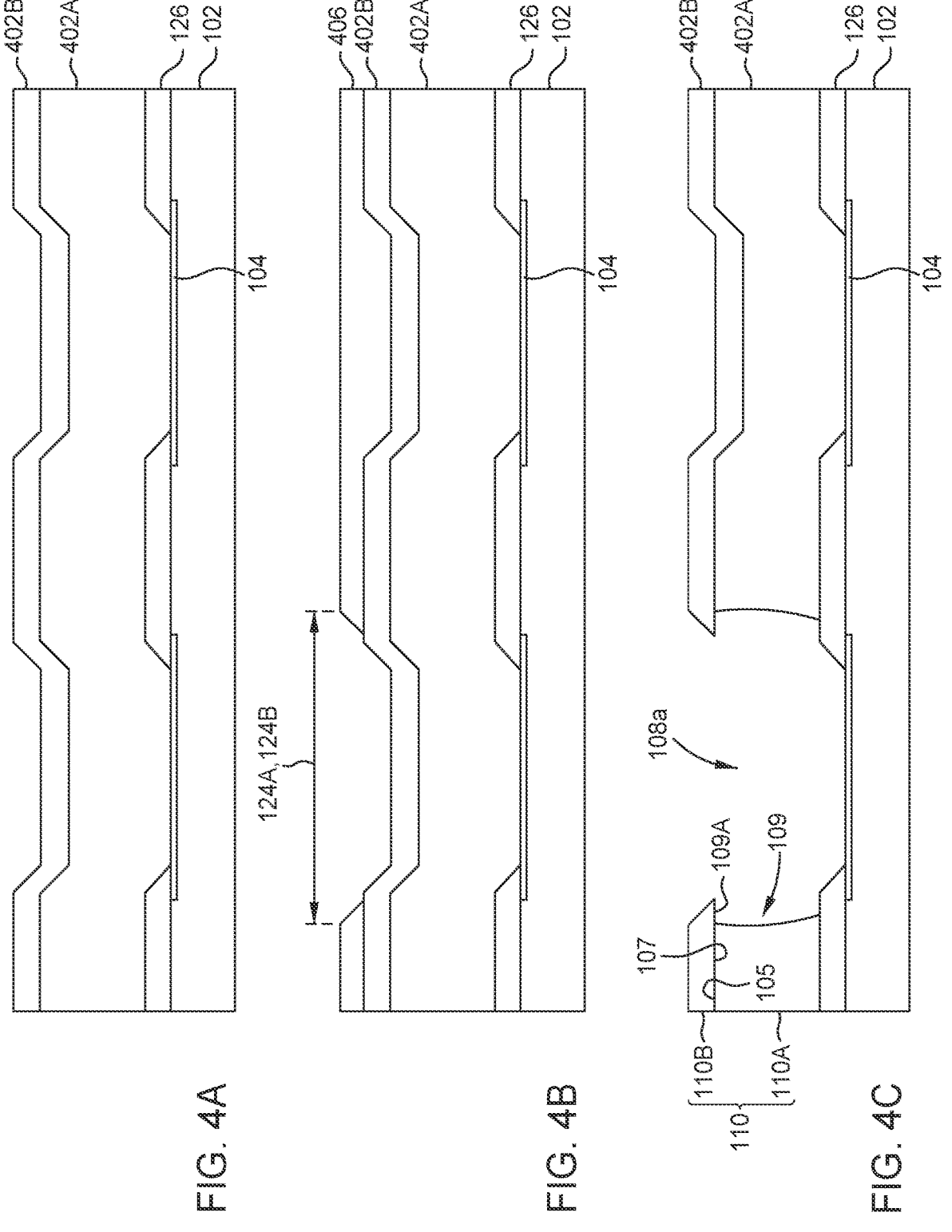
FIGS. 4A-4K are schematic, cross-sectional views of a substrate during a method for forming a sub-pixel circuit according embodiments.

At operation 301, as shown in FIG. 4A, a body structure layer 402A and top structure layer 402B are deposited over the substrate 102. The body structure layer 402A is disposed over the PDL structures 126 and the metal-containing layers 104. The top structure layer 402B is disposed over the body structure layer 402A. The body structure layer 402A corresponds to the body structure 110A and the top structure layer 402B corresponds to the top structure 110B of the overhang structures 110.

At operation 302, as shown in FIG. 4B, a resist 406 is disposed and patterned. The resist 406 is disposed over the top structure layer 402B. The resist 406 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 406 determines whether the resist is a positive resist or a negative resist. The resist 406 is patterned to form one of a pixel opening 124A of the dot-type architecture 101C or a pixel opening 124B of the line-type architecture 101D of a first sub-pixel 108a. The patterning is one of a photolithography, digital lithography process, or laser ablation process.

At operation 303, as shown in FIG. 4C, portions of the top structure layer 402B and the body structure layer 402A exposed by the pixel opening 124A, 124B are removed. The top structure layer 402B exposed by the pixel opening 124A, 124B may be removed a dry etch process or a wet etch process. The body structure layer 402A exposed by the pixel opening 124A, 124B may be removed by a dry etch process of a wet etch process. Operation 303 forms the overhang structures 110 of the first sub-pixel 108a. The etch selectivity between the materials of the top structure layer 402B corresponding to the top structure 110B and the body structure layer 402A corresponding to the body structure 110A and the etch processes to remove the exposed portions of the top structure layer 402B and the body structure layer 402A provide for the bottom surface 107 of the top structure 110B being wider than the top surface 105 of the body structure 110A to form the top extension 109A that defines the overhang 109 (as shown in FIGS. 1A, 1B, 2A, and 2B). The shadowing of the overhang 109 provides for evaporation deposition the OLED material 112 and the cathode 114.

Figure 4D:
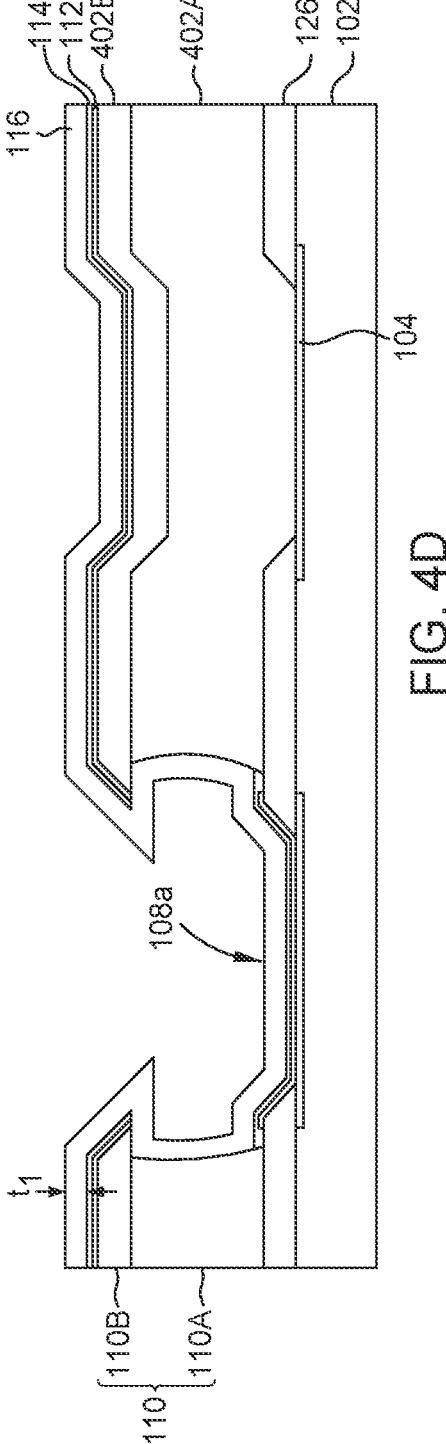

At operation 304, as shown in FIG. 4D, the OLED material 112 of the first sub-pixel 108*a*, the cathode 114, and the encapsulation layer 116 are deposited. The shadowing of the overhang 109 provides for evaporation deposition each of the OLED material 112 and a cathode 114. As further discussed in the corresponding description of FIG. 2, the shadowing effect of the overhang structures 110 define the OLED angle $\theta_{OLED}$ (shown in FIG. 2A) of the OLED material 112 and the cathode angle $\theta_{cathode}$ (shown in FIG. 2A) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. The encapsulation layer 116 is deposited over the cathode 114 with a thickness $t_1$. In embodiments including capping layers, the capping layers are deposited between the cathode 114 and the encapsulation layer 116. The capping layers may be deposited by evaporation deposition.

Figure 4E:
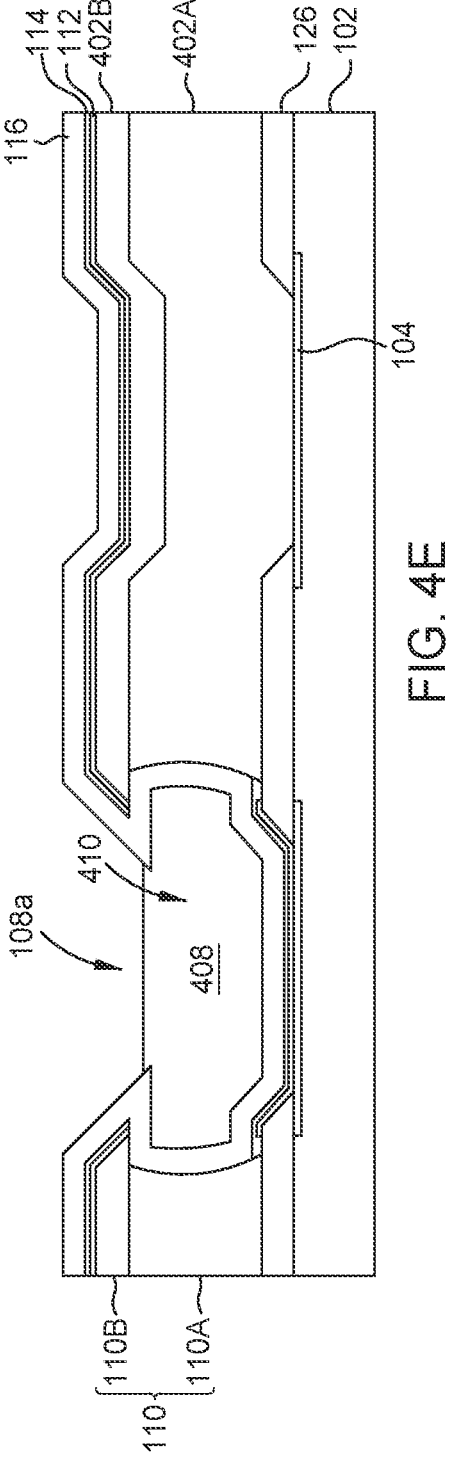
Figure 4F:
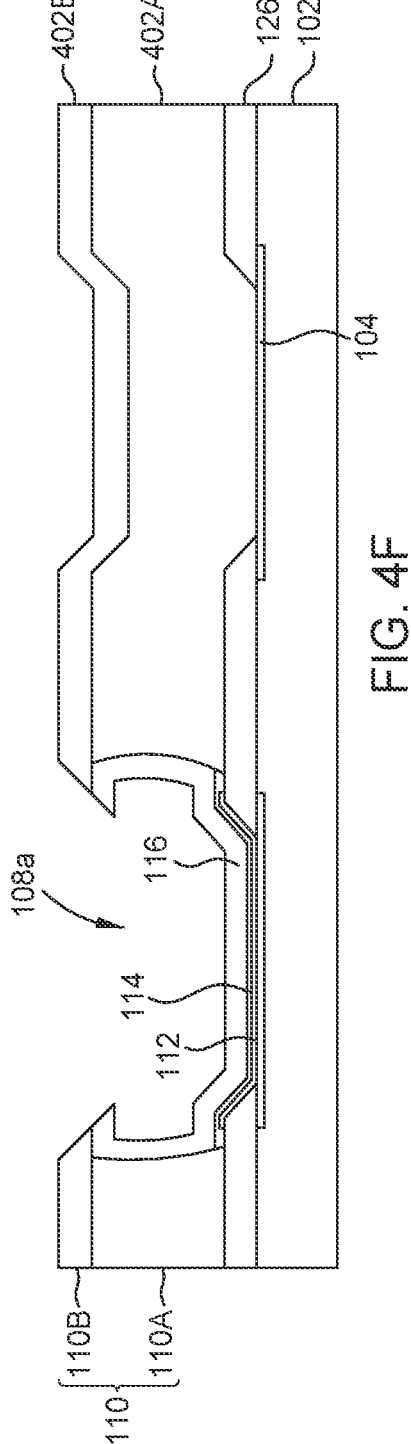
Figure 4G:
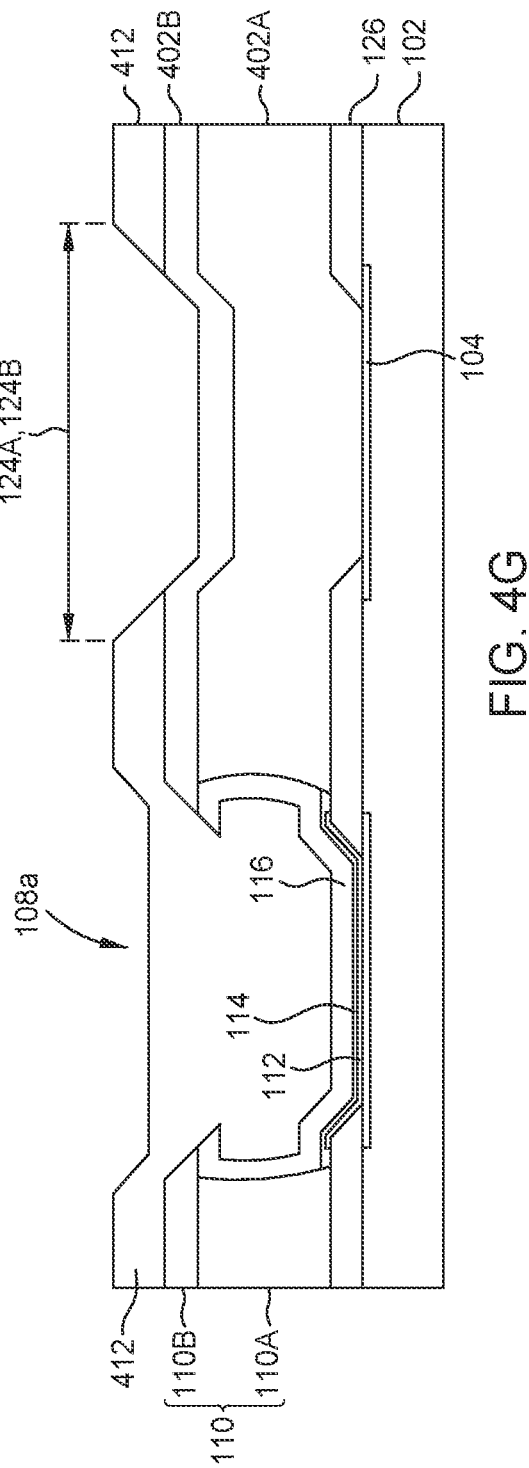

At operation 305, as shown in FIG. 4E, a resist 408 is formed in a well 410 of the first sub-pixel 108*a*. In one embodiment, a thickness of the resist 408 is different from a thickness of the resist 406. At operation 306, as shown in FIGS. 4F, the encapsulation layer 116, the cathode 114, and the OLED material 112 exposed by the resist 408 are removed. The encapsulation layer 116, the cathode 114, and the OLED material 112 exposed by resist 408 may be removed by wet etch or dry etch processes. The resist 408 is removed from the well, leaving behind the overhang structures 110. At operation 307, as shown in FIGS. 4G, a resist 412 is disposed and patterned. In one embodiment, a thickness of the resist 412 is different from the thickness of the resist 406 and the resist 408. The resist 412 is disposed over the top structure layer 402B and the top structure 1106 of the first sub-pixel 108*a*. The resist 412 is patterned to form one of the pixel opening 124A of the dot-type architecture 101C or the pixel opening 124B of the line-type architecture 101D of a second sub-pixel 108*b*.

Figure 4H:
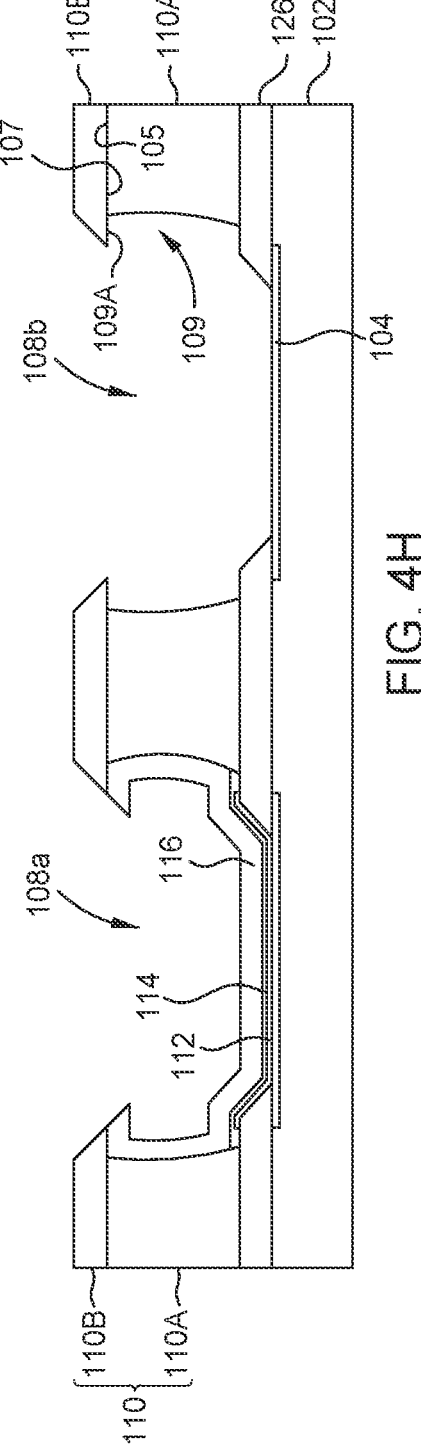

At operation 308, as shown in FIG. 4H, portions of the top structure layer 402B and the body structure layer 402A exposed by the pixel opening 124A, 1246 of the second sub-pixel 108*b* are removed. The top structure layer 402B exposed by the pixel opening 124A, 124B may be removed a dry etch process or wet etch process. The body structure layer 402A exposed by the pixel opening 124A, 124B may be removed by a dry etch process or a wet etch process. Operation 308 forms the overhang structures 110 of the second sub-pixel 108*b*. The etch selectivity of the materials of the top structure layer 402B corresponding to the top structure 1106 and the body structure layer 402A corresponding to the body structure 110A and the etch processes to remove the exposed portions of the top structure layer 402B and the body structure layer 402A provide for the bottom surface 107 of the top structure 1106 being wider than the top surface 105 of the body structure 110A to form the top extension 109A that defines the overhang 109 (as shown in FIG. 1A). The shadowing of the overhang 109 provides for evaporation deposition the OLED material 112 and the cathode 114.

Figure 4I:
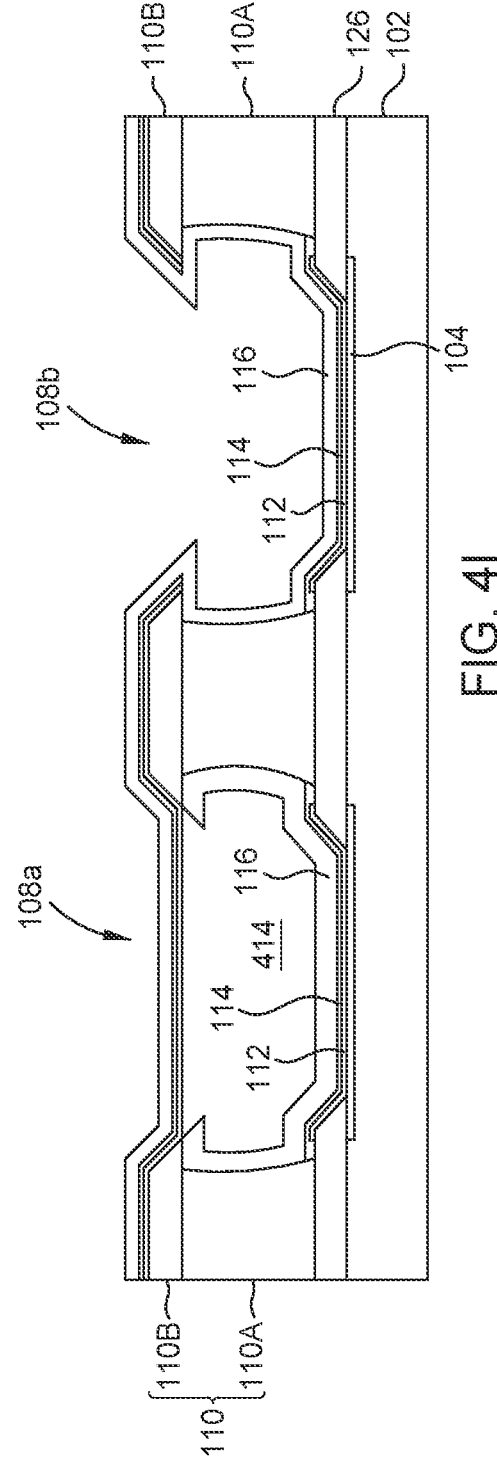

At operation 309, as shown in FIG. 4I, the OLED material 112 of the second sub-pixel 108*b*, the cathode 114, and the encapsulation layer 116 are deposited. A resist 414 is formed in a well of the first sub-pixel 108*a* and the OLED material 112, the cathode 114 and the encapsulation layer 116 are deposited over the resist 414. In one embodiment, the resist 414 has a thickness that is different from the thickness of the resist 408 and the resist 412. In embodiments including capping layers, the capping layers are deposited between the cathode 114 and the encapsulation layer 116. The capping layers may be deposited by evaporation deposition. The shadowing of the overhang 109 provides for evaporation deposition of the OLED material 112 and a cathode 114. The shadowing effect of the overhang structures 110 define the OLED angle $\theta_{OLED}$ of the OLED material 112 and the cathode angle $\theta_{cathode}$ of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. The encapsulation layer 116 is deposited over the cathode 114 with a thickness $t_2$. In one embodiment, the thickness $t_2$ is lesser than the thickness $t_1$. In another embodiment, the thickness $t_2$ is greater than the thickness $t_1$.

Figures 4J, 4K:
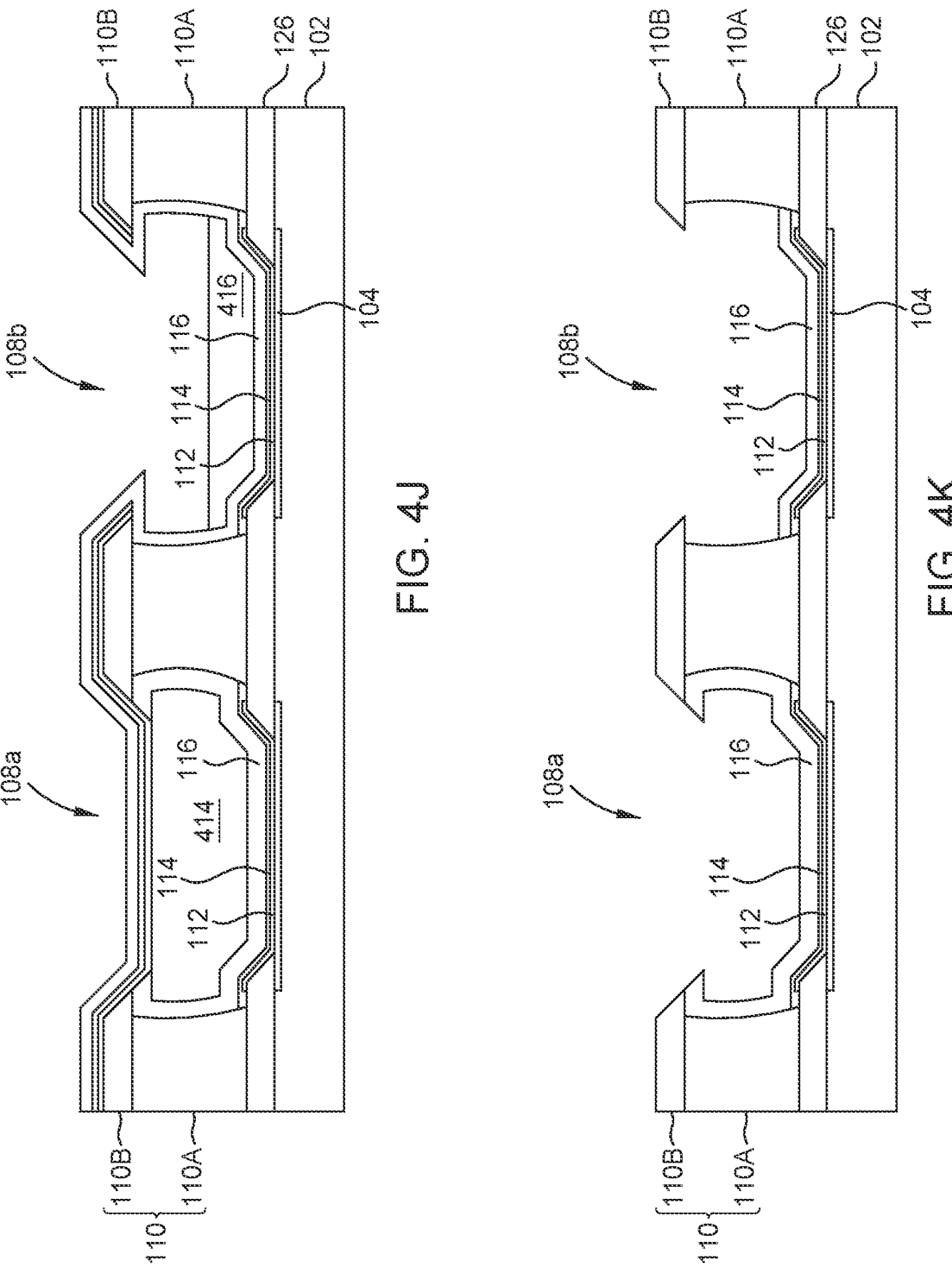

At operation 310, as shown in FIG. 4J, a resist 416 is formed in a well of the second sub-pixel 108*b*. In one embodiment, a thickness of the resist 416 is different from a thickness of the resist 406, the resist 408, and the resist 412. At operation 311, as shown in FIG. 4K, the encapsulation layer 116, the cathode 114, and the OLED material 112 exposed by the resist 416 are removed. The encapsulation layer 116, the cathode 114, and the OLED material 112 exposed by resist 416 may be removed by wet etch or dry etch processes. The resist 416 is removed from the well, leaving behind the overhang structures 110. Operations 301-311 described herein form the sub-pixel circuit 100 including two sub-pixels 106. Operations 306-310 may be repeated for each addition sub-pixel, e.g. for a third and/or a fourth sub-pixel. The encapsulation layer 116 for a third sub-pixel 108*c*, as shown in FIGS. 1A and 1B, has a thickness $t_3$. Any additional pixels 108*n* have an encapsulation layer 116 with a thickness tn. In one embodiment, the thickness $t_3$ of the encapsulation layer 116 in sub-pixel 108*c* is lesser than the thicknesses $t_1$ and $t_2$. In another embodiment, the thickness $t_3$ of the encapsulation layer 116 in sub-pixel 108*c* is greater than the thicknesses $t_1$ and $t_2$. In another embodiment, the thickness $t_3$ of the encapsulation layer 116 in sub-pixel 108*c* is lesser than the thickness $t_1$ and greater than the thickness $t_2$. In another embodiment, the thickness $t_3$ of the encapsulation layer 116 in sub-pixel 108*c* is greater than the thickness $t_1$ and lesser than the thickness $t_2$. In another embodiment, the thickness of the encapsulation layer 116 is increased as the wavelength of light emitted increases. In another embodiment, the thickness of the encapsulation layer 116 is decreased as the wavelength of light emitted increases.

Thicknesses, compositions, and deposition methods of the encapsulation layer 116 may be varied, as described above. By varying the encapsulation layer 116 compositions and deposition methods to create variations in thicknesses, the encapsulation layer 116 protects the deposited OLED material 112 from damage during layering and improves process yield and efficiency. The variation in encapsulation layer 116 thicknesses further controls the distance between the underside edge 206 and the top surface of the encapsulation layer 116, as shown in sub-pixels 108*b* and 108*c* in FIG. 1 and FIG. 2. The distances control the amount of etching and deposition that occurs under the overhang structures 110, leading to increased OLED material 112 protection during subsequent deposition and etching.

FIG. 5 is a flow diagram of a method 500 for forming a sub-pixel circuit 100. FIGS. 6A-6H are schematic, cross-sectional views of a substrate 102 during the method 500 for forming the sub-pixel circuit 100 according to embodiments described herein.

Figures 6A, 6B:
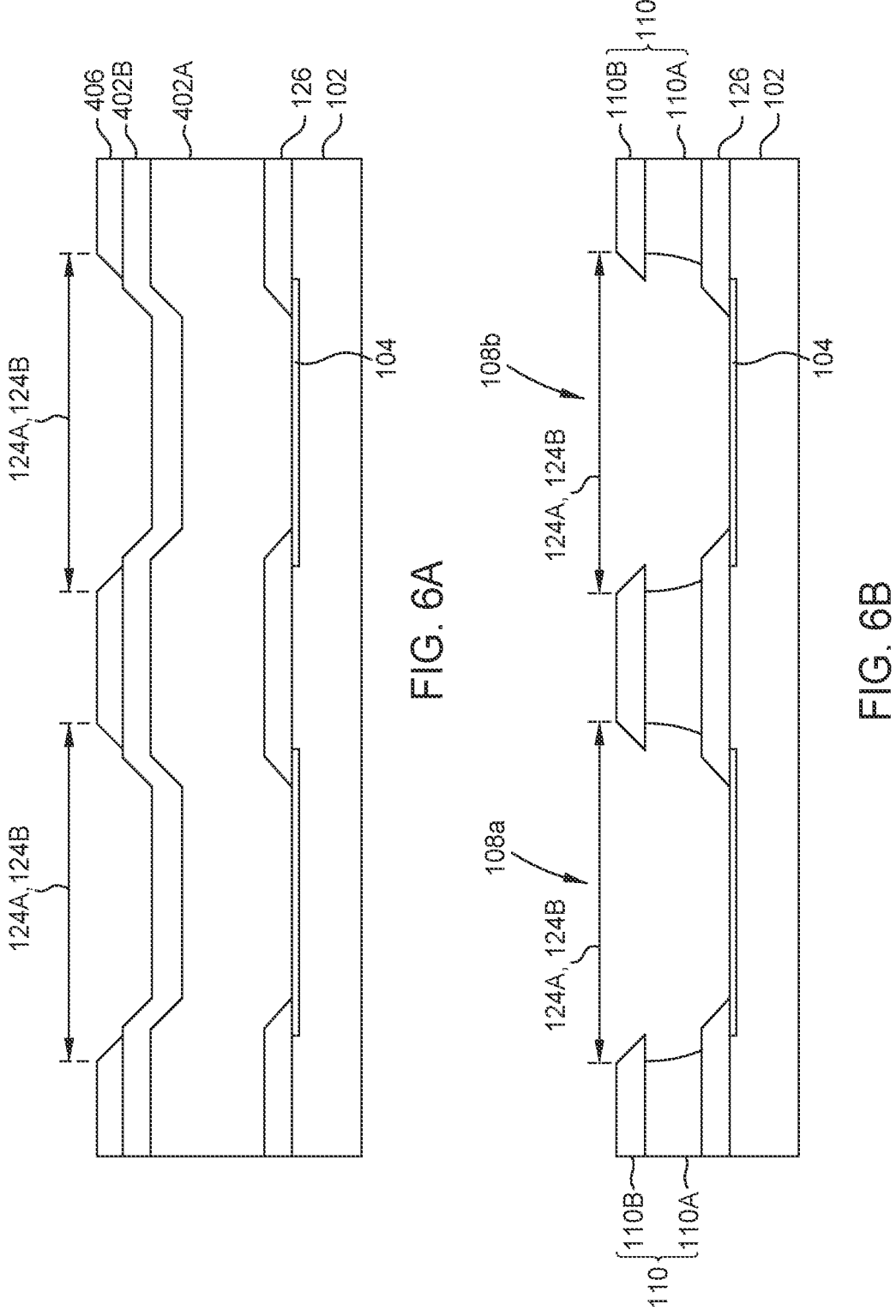
FIGS. 6A-6H are schematic, cross-sectional views of a substrate during a method for forming a sub-pixel circuit according embodiments described herein.

At operation 501, as shown in FIG. 6A, a body structure layer 402A and a top structure layer 402B are deposited over the substrate 102. The body structure layer 402A is disposed over the PDL structures 126 and the metal-containing layers 104. The top structure layer 402B is disposed over the body structure layer 402A. The body structure layer 402A corresponds to the body structure 110A and the top structure layer 402B corresponds to top structure 110B of the overhang structures 110. A resist 406 is disposed and patterning over the top structure layer 402B to expose pixel openings 124A, 124B. At operation 502, as shown in FIG. 6B, the overhang structure portions of the top structure layer 402B and the body structure layer 402A exposed by the pixel opening 124A, 124B are removed. The top structure layer 402B exposed by the pixel opening 124A, 124B may be removed a dry etch process or a wet etch process. The body structure layer 402A exposed by the pixel opening 124A, 124B may be removed by a dry etch process or a wet etch process.

Figures 6C, 6D:
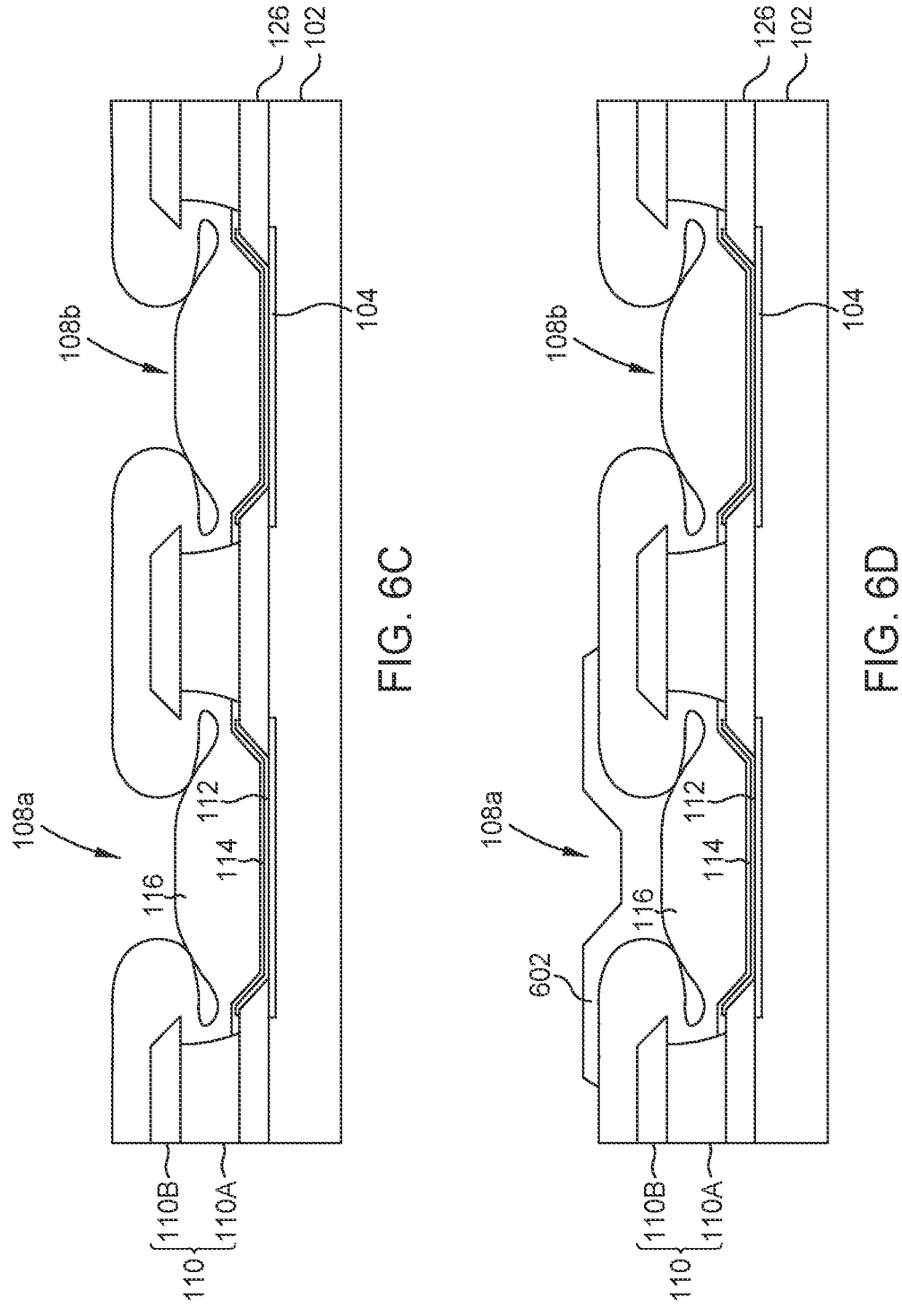

At operation 503, as shown in FIG. 6C, the OLED material 112 of the first sub-pixel 108$a$, the cathode 114, and the encapsulation layer 116 are deposited. In embodiments including capping layers, the capping layers are deposited between the cathode 114 and the encapsulation layer 116. The capping layers may be deposited by evaporation deposition. As further discussed in the corresponding description of FIG. 2B, the shadowing effect of the overhang structures 110 define the OLED angle $\theta_{OLED}$ (shown in FIG. 2A) of the OLED material 112 and the cathode angle $\theta_{cathode}$ (shown in FIG. 2A) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. The encapsulation layer 116 is deposited over the cathode 114. The encapsulation layer 116 of sub-pixel 108$a$ has the gaps 150 partially underneath the top structure 110B. Each of the gaps 150 is defined by the first portion 151, the second portion 152, the third portion 153, and the first portion 151 contacting the third portion 153 of the encapsulation layer 116. The first portion 151 of the encapsulation layer 116 is disposed over the cathode 114. In some embodiments, the first portion 151 contacts the cathode 114. The second portion 152 of the encapsulation layer 116 is disposed over the sidewall 111 of the body structure 110A. In some embodiments, the second portion 152 contacts the sidewall 111 of the body structure 110A. The third portion 153 of the encapsulation layer 116 is disposed under the underside surface 117 of the top extension 109A of the top structure 110B. In some embodiments, the third portion 153 contacts the underside surface 117 of the top extension 109A of the top structure 110B. The first portion 151 of the encapsulation layer 116 contacts the third portion 153 of the encapsulation layer 116. The gaps 150 are sealed by the contact of the first portion 151 and the third portion 153.

Figures 6E, 6F:
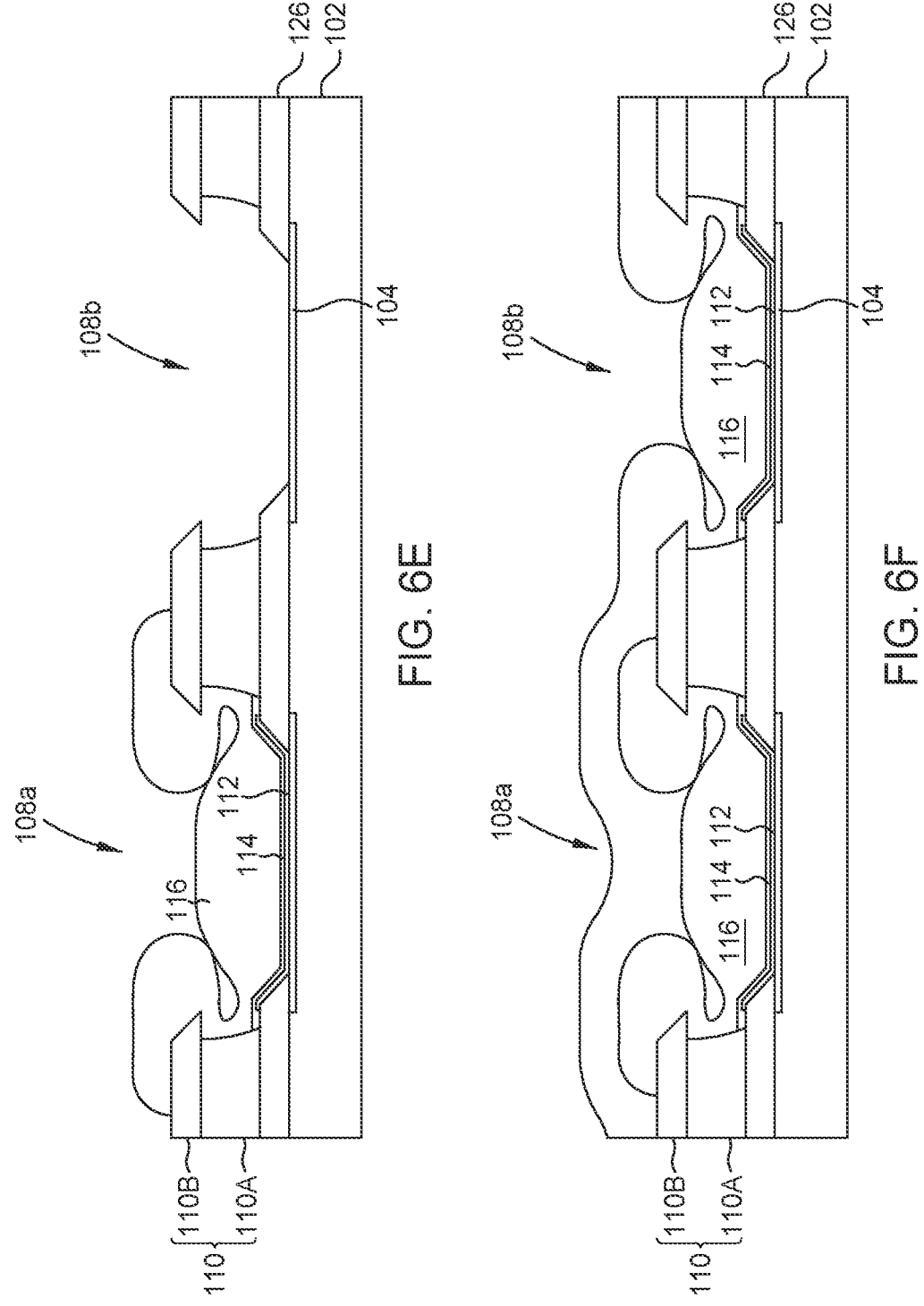

At operation 504, as shown in FIG. 6D, a resist 602 is formed in a well of the first sub-pixel 108$a$. Due to the contact of the first portion 151 of the encapsulation layer 116 and the third portion 153 of the encapsulation layer 116 the resist 602 cannot enter the gaps 150. The resist 602 cannot get underneath the top structure 110B due to the gaps 150 and the encapsulation layer 116. At operation 505, as shown in FIG. 6E, the encapsulation layer 116, the cathode 114, and the OLED material 112 exposed by the resist 602 are removed. The encapsulation layer 116, the cathode 114, and the OLED material 112 exposed by resist 602 may be removed by wet etch processes. The resist 602 is removed. Since the resist 602 is stopped from being trapped under the top structure 110B, the resist 602 is removed without leaving any resist 602 behind.

At operation 506, as shown in FIG. 6F, the OLED material 112 of the second sub-pixel 108$b$, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and a cathode 114. The shadowing effect of the overhang structures 110 define the OLED angle $\theta_{OLED}$ of the OLED material 112 and the cathode angle $\theta_{cathode}$ of the cathode 114. The OLED angle $\theta_{OLED}$ of the OLED material 112 and the cathode angle $\theta_{cathode}$ of the cathode 114 result from evaporation deposition of the OLED material 112 and the cathode 114. In one embodiment, the cathode 114 contacts the body structure 110A of the overhang structures 110. The encapsulation layer 116 is deposited over the cathode 114. The encapsulation layer 116 of sub-pixel 108$b$ has the gaps 150 partially underneath the top structure 1106. Each of the gaps 150 is defined by the first portion 151, the second portion 152, the third portion 153, and the first portion 151 contacting the third portion 153 of the encapsulation layer 116. The first portion 151 of the encapsulation layer 116 is disposed over the cathode 114. In some embodiments, the first portion 151 contacts the cathode 114. The second portion 152 of the encapsulation layer 116 is disposed over the sidewall 111 of the body structure 110A. In some embodiments, the second portion 152 contacts the sidewall 111 of the body structure 110A. The third portion 153 of the encapsulation layer 116 is disposed under the underside surface 117 of the top extension 109A of the top structure 1106. In some embodiments, the third portion 153 contacts the underside surface 117 of the top extension 109A of the top structure 1106. The first portion 151 of the encapsulation layer 116 contacts the third portion 153 of the encapsulation layer 116. The gaps 150 are sealed by the contact of first portion 151 and the third portion 153.

Figures 6G, 6H:
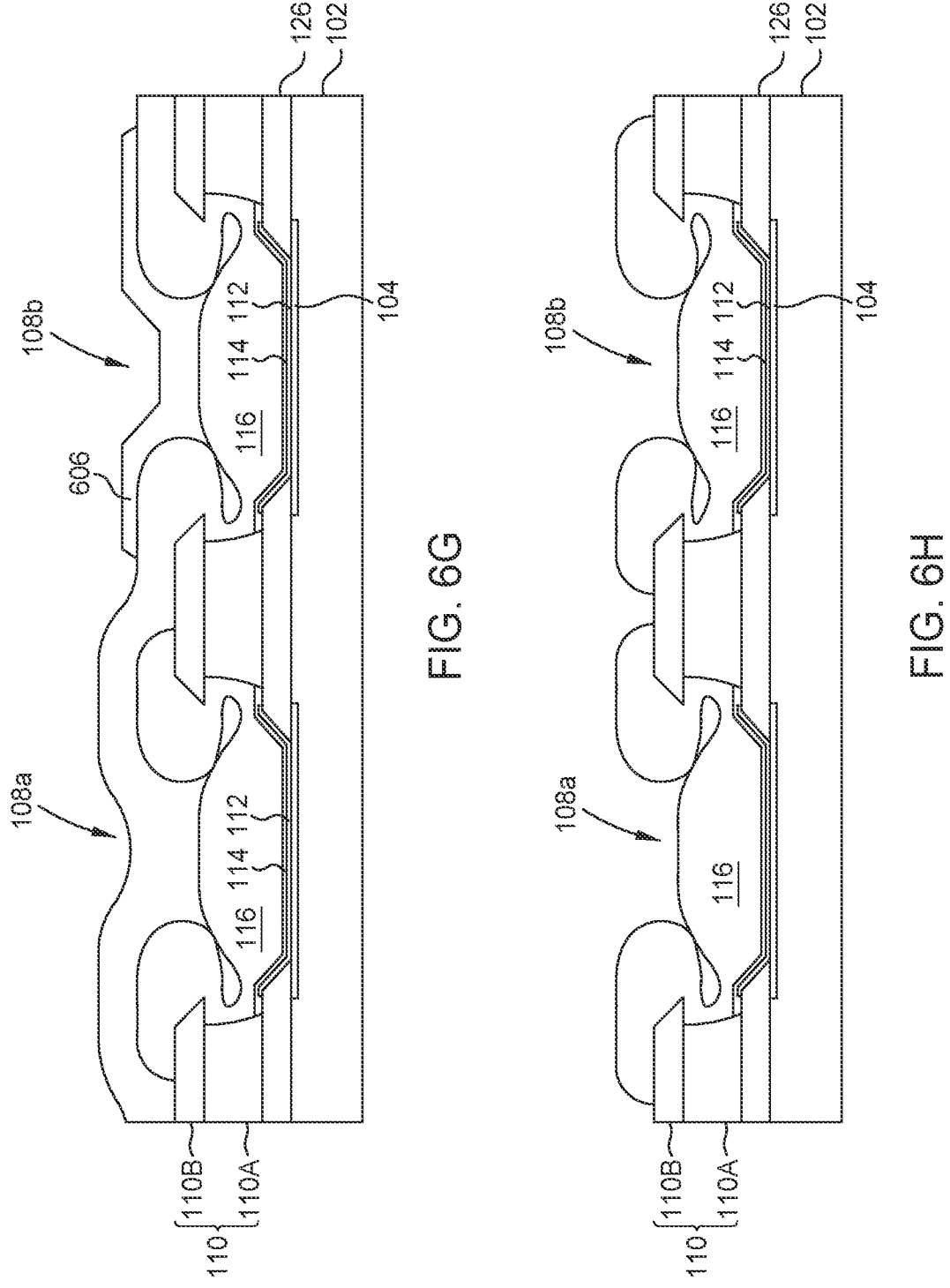

At operation 507, as shown in FIG. 6G, a resist 606 is formed in a well of the second sub-pixel 108$b$. Due to the contact of the first portion 151 of the encapsulation layer 116 and the third portion 153 of the encapsulation layer 116 the resist 606 cannot enter the gaps 150. The resist 606 cannot get underneath the top structure 110B due to the gaps 150 and the encapsulation layer 116. At operation 508, as shown in FIG. 6H, the encapsulation layer 116, the cathode 114, and the OLED material 112 exposed by the resist 606 are removed. The encapsulation layer 116, the cathode 114, and the OLED material 112 exposed by resist 606 may be removed by wet etch processes. The resist 606 is removed. Since the resist 606 is stopped from being trapped under the top structure 110B, the resist 606 is removed without leaving any resist 602 behind.

Operations 501-508 described herein form the sub-pixel circuit 100 including two or more sub-pixels 106. Operations 505-508 may be repeated for each addition sub-pixel, e.g. for a third and/or a fourth sub-pixel. The encapsulation layer 116 for a third sub-pixel 108$c$, as shown in FIG. 1B, has the gaps 150 partially underneath the top structure 110B. Each of the gaps 150 is defined by the first portion 151, the second portion 152, the third portion 153, and the first portion 151 contacting the third portion 153 of the encapsulation layer 116. The first portion 151 of the encapsulation layer 116 is disposed over the cathode 114. In some embodiments, the first portion 151 contacts the cathode 114. The second portion 152 of the encapsulation layer 116 is disposed over the sidewall 111 of the body structure 110A. In some embodiments, the second portion 152 contacts the sidewall 111 of the body structure 110A. The third portion 153 of the encapsulation layer 116 under the underside surface 117 of the top extension 109A of the top structure 110B. In some embodiments, the third portion 153 contacts the underside surface 117 of the top extension 109A of the top structure 110B. The first portion 151 of the encapsulation layer 116 contacts the third portion 153 of the encapsulation layer 116. The gaps 150 are sealed by the contact of first portion 151 and the third portion 153. Any additional pixels 108$n$ have an encapsulation layer 116 with the gaps 150 sealed by the contact of the first portion 151 and the third portion 153.

In summation, described herein are device relate to subpixel circuits and methods of forming sub-pixel circuits that may be utilized in a display such as an organic light-emitting diode (OLED) display. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition may be utilized for deposition of an OLED material and cathode. The overhang structures define deposition angles, i.e., provide for a shadowing effect during evaporation deposition, for each of the OLED material and the cathode such the OLED material does not contact the body structure and the cathode contacts the body structure according to some embodiments. The encapsulation layer of a respective sub-pixel is disposed over the cathode with the encapsulation layer extending under at least a portion of each of the adjacent overhang structures and over a sidewall of each of the adjacent overhang structures. The encapsulation layers in each sub-pixel are varied in thickness in order to protect deposited layers during etching of encapsulation subsequent layers. The variation in thickness can be descending, ascending, or dependent on the OLED material deposited (e.g., the color of the OLED). The gaps 150 in the encapsulation layer 116 are present and sealed to prevent resist from entering under the top structure 1106. The resists 602, 606 are prevented from becoming trapped and can be properly removed along with the encapsulation layer 116, cathode 114, and OLED material 112.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
   a substrate;
   pixel-defining layer (PDL) structures disposed over the substrate and defining sub-pixels of the device; and
   a plurality of overhang structures, each overhang structure defined by a top extension of a top structure extending laterally past a body structure, each body structure disposed over an upper surface of each PDL structure, adjacent overhang structures of the plurality overhang structures defining a plurality of sub-pixels including a first sub-pixel;
   the first sub-pixel comprising:
      a first anode;

a first organic light-emitting diode (OLED) material disposed over the first anode and under the adjacent overhang structures;
      a first cathode disposed over the first OLED material and under the adjacent overhang structures; and
      a first encapsulation layer having:
         a first portion of the first encapsulation layer disposed over the first cathode,
         a second portion of the first encapsulation layer disposed over a sidewall of the body structure,
         a third portion of the first encapsulation layer under an underside surface of the top extension of the top structure,
         a fourth portion of the first encapsulation layer disposed over a top surface of the top structure,
         a gap defined by the first portion, the second portion, and the third portion, the first portion of the first encapsulation layer contacting the third portion of the first encapsulation layer, and
         a space between the fourth portion of the first encapsulation layer and the fourth portion of a second encapsulation layer disposed over the top surface of the top structure.

2. The device of claim 1, further comprising:
   a second sub-pixel comprising:
      a second anode;
      a second organic light-emitting diode (OLED) material disposed over and in contact with the second anode and under the adjacent overhang structures;
      a second cathode disposed over the second OLED material and under the adjacent overhang structures; and
      a second encapsulation layer having the gap defined by the first portion of the second encapsulation layer disposed over the second cathode, the second portion of the second encapsulation layer disposed over the sidewall of the body structure, and the third portion of the second encapsulation layer under the underside surface of the top extension of the top structure, the first portion of the second encapsulation layer contacting the third portion of the second encapsulation layer.

3. The device of claim 2, further comprising a third sub-pixel comprising:
   a third anode;
   a third organic light-emitting diode (OLED) material disposed over and in contact with the third anode and under the adjacent overhang structures;
   a third cathode disposed over the third OLED material and under the adjacent overhang structures; and
   a third encapsulation layer having the gap defined by the first portion of the third encapsulation layer disposed over the third cathode, the second portion of the third encapsulation layer disposed over the sidewall of the body structure, and the third portion of the third encapsulation layer under the underside surface of the top extension of the top structure, the first portion of the third encapsulation layer contacting the third portion of the third encapsulation layer.

4. The device of claim 3, wherein the first encapsulation layer, the second encapsulation layer, and the third encapsulation layer comprise a silicon nitride material, silicon oxynitride material, silicon oxide material, or a combination thereof.

5. The device of claim 3, wherein the first encapsulation layer comprises a material different than at least one of the second encapsulation layer or the third encapsulation layer.

6. The device of claim 1, wherein the body structure comprises an inorganic material or a metal-containing material.

7. The device of claim 3, wherein the first encapsulation layer, the second encapsulation layer, and the third encapsulation layer include at least two layers of a silicon-containing material, the at least two layers of the silicon-containing material of at least one the first encapsulation layer, the second encapsulation layer, and the third encapsulation layer is different than each other.

8. The device of claim 2, wherein the first OLED material is disposed over and in contact with the first anode and is disposed under the overhang structures such that the first OLED material contacts the PDL structure and the second OLED material is disposed over and in contact with the second anode and is disposed under the overhang structures such that the second OLED material contacts the PDL structure.

9. A device, comprising:
a substrate;
pixel-defining layer (PDL) structures disposed over the substrate and defining sub-pixels of the device; and
a plurality of overhang structures, each overhang structure defined by a top extension of a top structure extending laterally past a body structure to form an overhang, each body structure disposed over an upper surface of each PDL structure, adjacent overhang structures of the plurality overhang structures defining a plurality of sub-pixels including a first sub-pixel and a second sub-pixel;
the first sub-pixel comprising:
a first anode;
a first organic light-emitting diode (OLED) material disposed over the first anode and under the adjacent overhang structures;
a first cathode disposed over the first OLED material and under the adjacent overhang structures; and
a first encapsulation layer having an inner surface and an outer surface, the inner surface contacting the first cathode, a sidewall of the body structure, an underside surface of the top extension of the top structure, and a top surface of the top structure, the outer surface enclosing a void space outside the first encapsulation layer; and
the second sub-pixel comprising:
a second anode;
a second organic light-emitting diode (OLED) material disposed over the second anode and under the adjacent overhang structures;
a second cathode disposed over the second OLED material and under the adjacent overhang structures; and
a second encapsulation layer having the inner surface and outer surface, the inner surface contacting the second cathode, the sidewall of the body structure, the underside surface of the top extension of the top structure, and the outer surface of the first encapsulation layer over the top structure, the outer surface enclosing the void space outside the second encapsulation layer and the inner surface of the second encapsulation layer overlapping the outer surface of the first encapsulation layer over the top structure.

10. The device of claim 9, further comprising a third sub-pixel comprising:
a third anode;

a third organic light-emitting diode (OLED) material disposed over and in contact with the third anode and under the adjacent overhang structures;
a third cathode disposed over the third OLED material and under the adjacent overhang structures and contacting a portion of the overhang structures; and
a third encapsulation layer having the inner surface and the outer surface, the inner surface contacting the third cathode, the sidewall of the body structure, and the underside surface of the top extension of the top structure, the outer surface enclosing the void space outside the third encapsulation layer.

11. The device of claim 10, wherein the first encapsulation layer, the second encapsulation layer, and the third encapsulation layer comprise a silicon nitride material, silicon oxynitride material, silicon oxide material, or a combination thereof.

12. The device of claim 9, wherein the body structure comprises an inorganic material, non-conductive material, or a metal-containing material.

13. The device of claim 9, wherein the top structure comprises a non-conductive material, an inorganic material, or a metal-containing material.

14. The device of claim 9, wherein the first cathode extends to contact the PDL structure past an endpoint of the first OLED material and the second cathode extends to contact the PDL structure past an endpoint of the second OLED material.

15. The device of claim 9, wherein the first OLED material is disposed over and in contact with the first anode and is disposed under the overhang structures such that the first OLED material contacts the PDL structure and the second OLED material is disposed over and in contact with the second anode and is disposed under the overhang structures such that the second OLED material contacts the PDL structure.

16. A device, comprising:
a substrate;
pixel-defining layer (PDL) structures disposed over the substrate and defining sub-pixels of the device; and
a plurality of overhang structures, each overhang structure defined by a top extension of a top structure extending laterally past a body structure, each body structure disposed over an upper surface of each PDL structure, adjacent overhang structures of the plurality overhang structures defining a plurality of sub-pixels including a first sub-pixel;
the first sub-pixel comprising:
a first anode;
a first organic light-emitting diode (OLED) material disposed over and in contact with the first anode and under the adjacent overhang structures;
a first cathode disposed over the first OLED material and under the adjacent overhang structures; and
a first encapsulation layer having:
a first portion of the first encapsulation layer contacting the first cathode,
a second portion of the first encapsulation layer contacting a sidewall of the body structure, and
a third portion of the first encapsulation layer contacting an underside surface of the top extension of the top structure,
a fourth portion of the first encapsulation layer contacting a top surface of the top structure,
a gap defined by the first portion, the second portion, and the third portion, the first portion of the first encapsulation layer contacting the third portion of the first encapsulation layer, and a space between the fourth portion of the first encapsulation layer and the fourth portion of a second encapsulation layer contacting the top surface of the top structure.

17. The device of claim 16, wherein the first encapsulation layer comprises a silicon nitride material, silicon oxynitride material, silicon oxide material, or a combination thereof.

18. The device of claim 16, wherein the first encapsulation layer includes at least two layers of a silicon-containing material.

19. The device of claim 16, wherein the body structure comprises an inorganic material or a metal-containing material.

20. The device of claim 16, wherein the first cathode extends to contact the PDL structure past an endpoint of the first OLED material.

21. A device, comprising:

a substrate;

a sub-pixel comprising:

an anode, a first organic light-emitting diode (OLED) material disposed over the anode, and a first cathode disposed over the first OLED material;

a pixel-defining layer (PDL) structure disposed over the substrate;

an overhang structure defined by a top extension of a top structure extending laterally past a body structure and over a portion of the first cathode, the body structure disposed over an upper surface of the PDL structure, a first encapsulation layer disposed on the overhang structure to form an enclosed space under the top extension of the top structure and form a top space over the top surface of the top structure wherein:

the enclosed space is enclosed by portions of the first encapsulation layer disposed over the first cathode, over a sidewall of the body structure, and under an underside surface of the top structure, and the top space is between an edge of the first encapsulation layer and the edge of a second encapsulation layer.

22. The device of claim 21, wherein a material is not disposed in the enclosed space.

23. The device of claim 21, wherein an intermediate layer is disposed in the top space.

* * * * *